US008554746B2

(12) United States Patent
Weinberger et al.

(10) Patent No.: US 8,554,746 B2
(45) Date of Patent: Oct. 8, 2013

(54) MULTIPLE-SOURCE DATA COMPRESSION

(75) Inventors: Marcelo Weinberger, San Jose, CA (US); Raul Herman Etkin, Mountain View, CA (US); Erik Ordenllich, San Jose, CA (US); Gadiel Seroussi, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 186 days.

(21) Appl. No.: 12/859,220

(22) Filed: Aug. 18, 2010

(65) Prior Publication Data

US 2012/0047113 A1    Feb. 23, 2012

(51) Int. Cl.
*G06F 17/00* (2006.01)
(52) U.S. Cl.
USPC ........... 707/693; 707/737; 380/217; 382/232; 709/247
(58) Field of Classification Search
None
See application file for complete search history.

(56) References Cited

U.S. PATENT DOCUMENTS

| | | | |
|---|---|---|---|
| 6,169,820 | B1 | 1/2001 | Wade et al. |
| 6,999,598 | B2 | 2/2006 | Foote et al. |
| 7,830,258 | B2 * | 11/2010 | McAllister ................ 340/572.1 |
| 8,077,740 | B2 * | 12/2011 | Elder et al. .................... 370/468 |
| 2004/0202374 | A1 * | 10/2004 | Venkataraman ............. 382/239 |
| 2006/0153286 | A1 | 7/2006 | Anderson et al. |
| 2009/0063432 | A1 * | 3/2009 | Aggarwal et al. ................. 707/4 |
| 2011/0249530 | A1 * | 10/2011 | Liu et al. ........................ 367/58 |
| 2011/0251986 | A1 * | 10/2011 | Potkonjak ....................... 706/21 |
| 2011/0281602 | A1 * | 11/2011 | Azimi-Sadjadi et al. ..... 455/507 |
| 2012/0014575 | A1 * | 1/2012 | Wang ............................ 382/128 |
| 2012/0182832 | A1 * | 7/2012 | Eperjesi et al. ................ 367/77 |

FOREIGN PATENT DOCUMENTS

WO    WO2008141225 A1    11/2008

OTHER PUBLICATIONS

Xiong et al, "Distributed Sorce Coding for Sensor Networks", IEEE, 2004.*
Vaidyanathan et al, "Data Aggregation Techniques in Sensor Networks", 2006.*
Fasolo et al, "In-network Aggregation Techniques for Wireless Sensor Networks: A Survey", Germany, 2007.*
Warneke et al, "MEMS for Distributed Wireless Sensor Networks", IEEE, 2002.*
Friedler et al, "Compressing Kinetic Data from Sensor Networks", Springer-Verlag Berlin, 2009.*
Garcia-Frias et al, "LDPC Codes for Compression of Multi-Terminal Sources With Hidden Markov Correlation", IEEE, 2003.*
Johnen et al, "Self-Stabilizing weight-based Clustering Algorithm for Ad hoc sensor Networks", 2006.*
Khedo et al, "READA: Redundancy Elimination for Accurate Data Aggregation in Wireless Sensor Networks", Wireless Sensor Network, Mar. 2010, p. 300-308.*
Pradhan et al, "Distributed sorce coding: Symmetric rates and applications to sensor networks", Univ of California, Berkeley, 2000.*
Pradhan et al, "Distributed Compression in a Dense Microsensor Network", IEEE, 2002.*

(Continued)

*Primary Examiner* — Hung Le

(57) ABSTRACT

One embodiment of the present invention is directed to a method for compressing data generated by multiple data sources. The method includes steps of partitioning data generated by the multiple data sources into data partitions, the data included in each data partition containing inter-data-source redundancies and, for each data partition, compressing the data in the data partition to remove the inter-data-source redundancies.

17 Claims, 24 Drawing Sheets

(56) References Cited

OTHER PUBLICATIONS

Pradhan et al, "Distributed Source Coding Using Syndromes (DIS-CUS): Design and Construction", IEEE, 2003.*
Stankovic et al, "Design of Slepian-Wolf Codes by Channel Code Partitioning", IEEE, 2004.*
Baek et al, "A Scalable Model for Energy Load Balancing in Large-scale Sensor Network", 2006.*
Deligiannakis et al, "Compressing Historical Information in Sensor Networks", 2004.*
Kiely et al, "Adaptive Linear Filtering Compression on Realtime Sensor Networks", Jan. 2009.*
Krishnamachari et al, "The Impact of Data Aggregation in Wireless Sensor Networks", 2002.*
Lin et al, "Onlime Information Compression in Sensor Networks", IEEE, 2006.*
Rajagopalan et al, "Data-Aggregation Techniques in Sensor Networks: A Survey", IEEE, 2006.*
Vaidyanathan et al, "Data Aggregation Techniques in Sensor Networks", 2004.*
"SEED Reference Manual: Standard for the Exchange of Earthquake Data", SEED Format Version 2.4, May 2010.*
Nijim et al, "Lossless Compression of Seismic Signals Using Differentiation", IEEE, 1996.*
Stearns et al, "Lossless Compression of Waveform Data for Efficient Storage and Transmission", IEEE, 1993.*
Magotra et al, "Lossless Data Compression Using Adpative Filters", IEEE, 1995.*
Ives et al, "Effects of Multiple-Pass Filtering in Lossless Predictive Compression of Waveform Data", IEEE, 2002.*
Mandyam et al, "Lossless Seismic Data Compression using Adaptive Linear Prediction", IEEE, 1996.*
Puthenpurayil et al, "Energy-aware Data Compression for Wireless Sensor Networks", 2007.*
Kiely et al, "Adaptive Linear Filtering Compression on Realtime Sensor Networks", 2009.*
Kiely, A.B., et al "A Seismic Data Compression System Using Sub-band Coding" TDA Progress Report, May 15, 1995, pp. 242-251.
Constantinescli, Cornelius et al., "Fast Peak Autocorrelation Finding for Periodicity-Exploiting Comopression Methods", IEEE. Computer Society, 2002, Data Compression Conference.
Mathew, Dominic, et al., "Compression of Psuedo-periodic signals using 2D Wavelet transforms", IEEE Computer Society, 2007, International Conference on Computational Intelligence and Multimedia Applications 2007, pp. 378-382.
Wang, You-Chiun et al, "Multiresetution Spatial and Temporal Coding in a Wireless Sensor Network for Long-Term Monitoring Applications", IEEE Computer Society, IEEE Transaction on Computers, Jun. 2009. pp. 827-838, vol. 58, No. 6.

* cited by examiner

FIGURE 2

MULTIPLE-SOURCE DATA COMPRESSION

TECHNICAL FIELD

The present invention is related to data compression and, in particular, to compression of data generated by multiple data sources.

BACKGROUND

Many different types of data compression have been developed during the past half century to facilitate electronic data transmission and electronic data storage. Many data-compression methods are lossless, in that, absent errors, decompression of data compressed by lossless compression techniques returns the original data. Many other compression methods are referred to as "lossy," because the methods obtain compression at the expense of loss of a portion of the original information content of the data that is compressed. Examples of lossless data compression include various types of entropy coding, including Huffman encoding and run-length encoding, which more efficiently encode the original data. Examples of lossy compression methods include the quantization of discrete-cosine-transform coefficients and resolution-decimation steps undertaken in MPEG compression of video signals. Compression methods can be characterized by a compression ratio achieved by applying the compression methods, where the compression ratio is the size of the compressed data produced by applying a compression method to initial or input data divided by the size of the initial or input data Many of the well-known data-compression techniques are oriented to compressing a given, initial amount of data or a data stream from a single data source. These compression techniques generally seek to identify and remove redundant data from a given signal or stream and/or to remove unneeded information from the data set or data stream. The emergence of distributed, networked systems of computers and other electronic components has been accompanied by efforts to further decrease compression ratios in order to decrease data-transmission overheads and delays and to obtain higher data throughput through bandwidth-limited transmission media.

BRIEF DESCRIPTION OF THE DRAWINGS

FIG. 2 illustrates data output by the distributed-sensor network illustrated in FIG. 1.

DETAILED DESCRIPTION

Examples of the present invention include systems and/or devices that compress data or data streams from multiple data sources, including, as one example, data messages, also referred to as "encoded signals," or data streams generated by multiple sensors of a distributed-sensor network. Distributed-sensor networks find utility in many different fields and areas of research, including distributed-sensor networks used for seismic analysis, meteorology, metrology, environmental monitoring, and a variety of other types of analysis and monitoring. In many cases, the data transmitted from multiple sensors are related. The sensors may be seismic sensors, each of which contains one or more multi-axis accelerometers to detect, record, and transmit signals related to ground movement. A distributed-seismic-sensor network may be used to monitor earthquake-prone areas, may be used for detecting weapons testing, and may be used for imaging subterranean features to facilitate oil and minerals extraction. Interdependencies among recordings of the seismic event by multiple sensors within a region of the geological substrate may result in a large amount of inter-sensor data redundancy. In another application, the sensors may monitor barometric pressure changes, temperature changes, and/or any of various other physical parameters amenable to instrument-based monitoring. Inter-sensor data redundancy is an attractive target for detection and elimination by multiple-source data-compression methods that represent examples of the present invention.

While interrelationships between multiple sensors in a distributed-sensor network represent one example or context for employing multiple-data-source data compression, multiple-data-source data-compression methods of the present invention may be applied to a variety of different contexts in which multiple data sources are interrelated, including multiple data sources interrelated by having similar or identical instrumental response functions, by proximity in geographical location or other spatial position, and/or by proximity in a temporal dimension. When constraints and characteristics of a multiple-data-source system suggest that data redundancies can be identified and eliminated across data messages or data streams generated by multiple data sources, then methods of multiple-data-source data compression that represent example implementations of the present invention may be applied.

In many contexts, the sensors are referred to as "sensor nodes" or simply as "nodes." Sensor nodes include one or more types of sensors in addition to processing and communications components, discussed below. In the following discussion, the term "sensor" is generally equivalent to the phrase "sensor node," except when used to refer to a sensing component within a sensor node.

Figure 1:
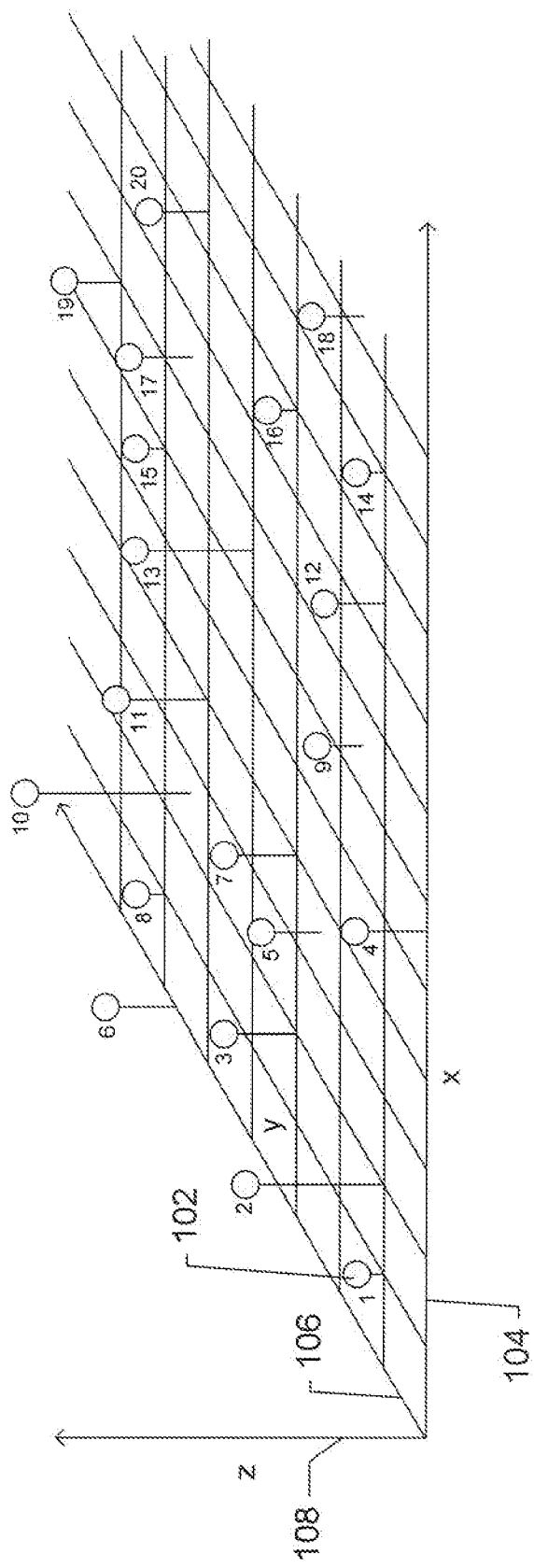
FIG. 1 illustrates a distributed-sensor network.

FIG. 1 illustrates a distributed-sensor network. In FIG. 1, each sensor is represented by a shaded disk, such as shaded disk 102. The sensors are distributed through a three-dimensional Cartesian space, as indicated by the mutually orthogonal Cartesian axes x 104, y 106, and z 108. Thus, each sensor has a position within the three-dimensional Cartesian space at any given point of time. In many applications of distributed-sensor networks, the positions of the sensors are fixed. However, in other distributed-sensor networks, the positions may vary, over time. For example, a network of seismic sensors may be distributed over a geographical region, each sensor located at a particular point in the region, and each sensor recording acceleration with respect to multiple axes, over time, to allow the locations and magnitudes of seismic events to be determined from sensor-reported data. Alternatively, the sensors may report data recorded during planned seismic events, such as test explosions or mechanical shocks, in order to construct images of subterranean features. In yet another example, sensors may be attached to animals within a geographical region in order to monitor behavior and interaction of the animals, attached to vehicles to study traffic flows, and applied to many other problem domains.

Figure 2:
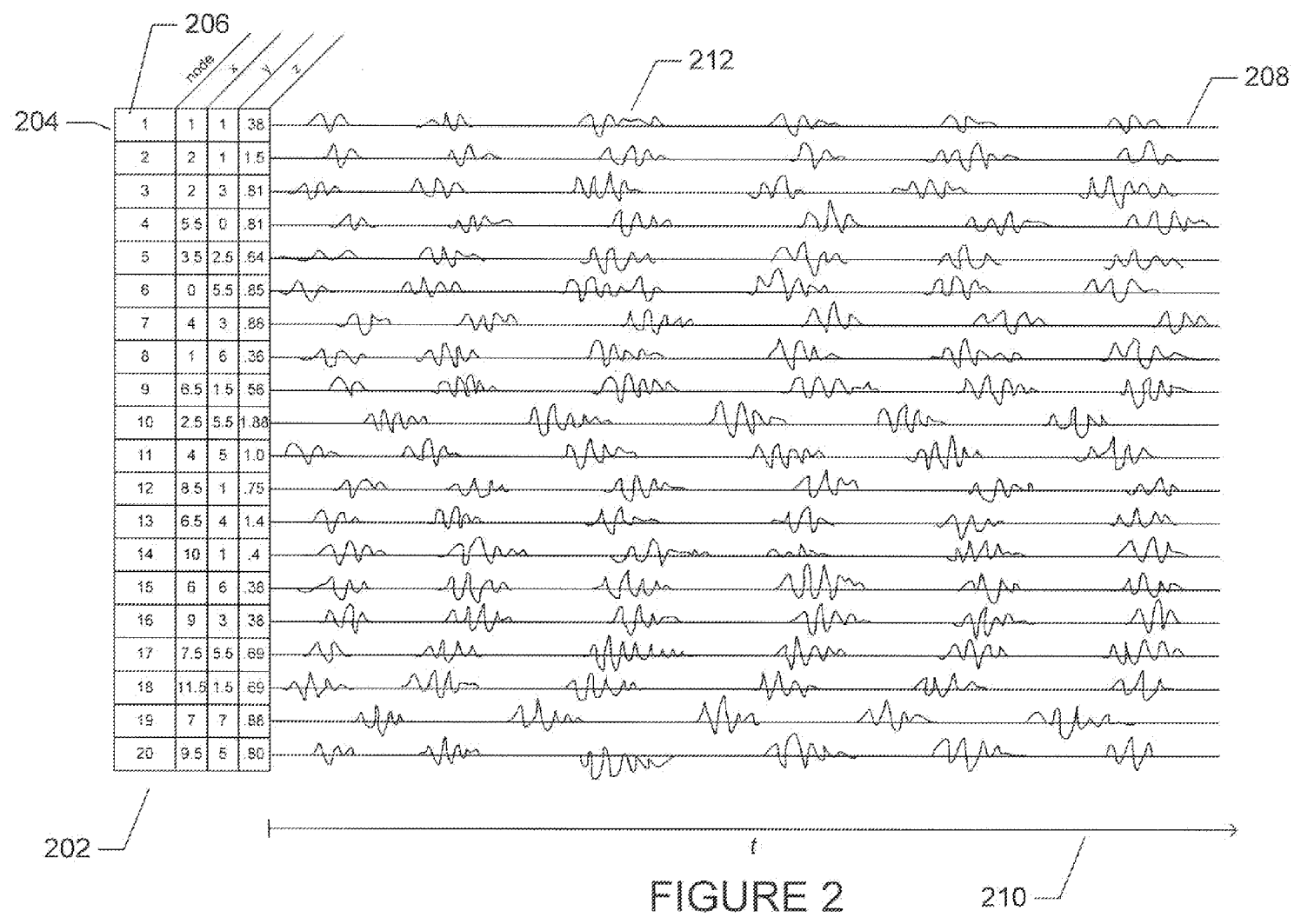

FIG. 2 illustrates data output by the distributed-sensor network illustrated in FIG. 1. It is assumed, for purposes of illustration, that the sensors in the distributed-sensor network are located at fixed positions. Each sensor, or distributed-sensor-network node, can therefore be characterized by either or both of a unique node number or name and a node position in three-dimensional Cartesian space. In FIG. 2, the table-like portion 202 of the illustration, at the left-hand side of the illustration, contains a list of the distributed-sensor-network nodes of the distributed-sensor network shown in FIG. 1, with each row in the table-like portion of the illustration including a node number and three Cartesian coordinates that represent one particular node. For example, the first row 204 in the table-like portion of the illustration indicates that node "1" 206 (102 in FIG. 1) is located at position (1, 1, 0.38). Extending from each entry in the table-like portion of the illustration in FIG. 2, for each node, is a timeline over which a continuous sensor signal is superimposed. For example, the timeline and superimposed signal 208 represent a signal recorded by sensor 1 over a period of time represented by the lower horizontal time axis 210. In FIG. 2, the signals are illustrated as continuous, two-dimensional analog signals such as a displacement or acceleration in one direction versus time. Using the example of a distributed-seismic-sensor network, the signal may represent change in position, speed, or acceleration of the sensor along one axis or direction with respect to time. The small clusters of wave forms, such as cluster 212 in the signal of the first node 208, may represent, for example, signal responses to earth movement generated by earthquakes or test explosions. The signals are generally recorded and encoded digitally, as floating-point values measured at particular points in time. Many different types of signals may be generated, recorded, and transmitted by sensors. For example, a sensor based on a three-axis accelerometer may record acceleration in three, mutually orthogonal directions, producing three different, time-aligned two-dimensional signals, such as those shown in FIG. 2, or, alternatively, a signal comprising the element values of a three-element vector measured and recorded at discrete points in time. These signals may be continuously recorded and discretized by the sensors, in value and in time, or, alternatively, may be discrete signals corresponding to measurements made at specific points in time.

Figure 3:
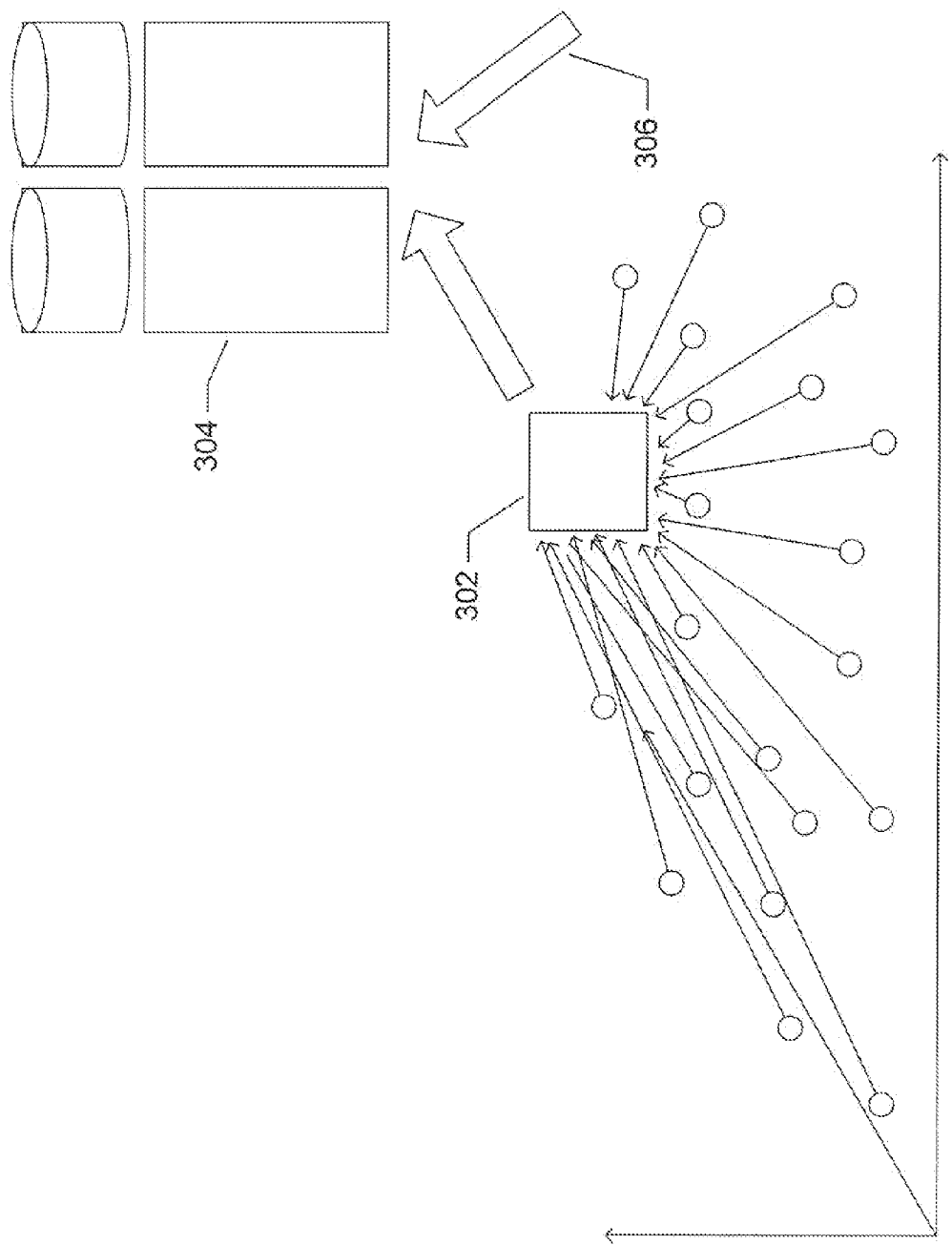
FIG. 3 illustrates data transfer from a distributed-sensor network to a remote data-storage and signal-processing facility.

FIG. 3 illustrates data transfer from a distributed-sensor network to a remote data-storage and signal-processing facility. In FIG. 3, the sensors of the distributed-sensor network, shown in FIG. 1, are illustrated as transmitting recorded sensor data to a sensor router 302 which, in turn, transmits the accumulated sensor data to a remote data-storage and signal-processing facility 304. Often, one or more additional sensor routers may concurrently transmit 306 accumulated sensor data from other distributed-sensor networks to the data-storage and signal-processing facility 304.

There are a variety of different methods by which the sensor data can be transmitted through the sensor router 302 to the remote data-storage and signal-processing facility. Perhaps the most simply implemented method is for the sensor router to simply collect data received from the sensors and forward the data, as a stream of sensor data, or data messages, to the remote data-storage and signal-processing facility. To further increase data-transmission efficiency, various types of well-known data-compression can be carried out in order to reduce data-transmission overheads. For example, each individual sensor may employ data compression techniques to compress the sensor data transmitted by the sensor to the sensor router. Alternatively, the sensor router may compress each received sensor-data message, received from a sensor within the distributed-sensor network, prior to forwarding the message to the remote data-storage and signal-processing facility.

Figure 4:
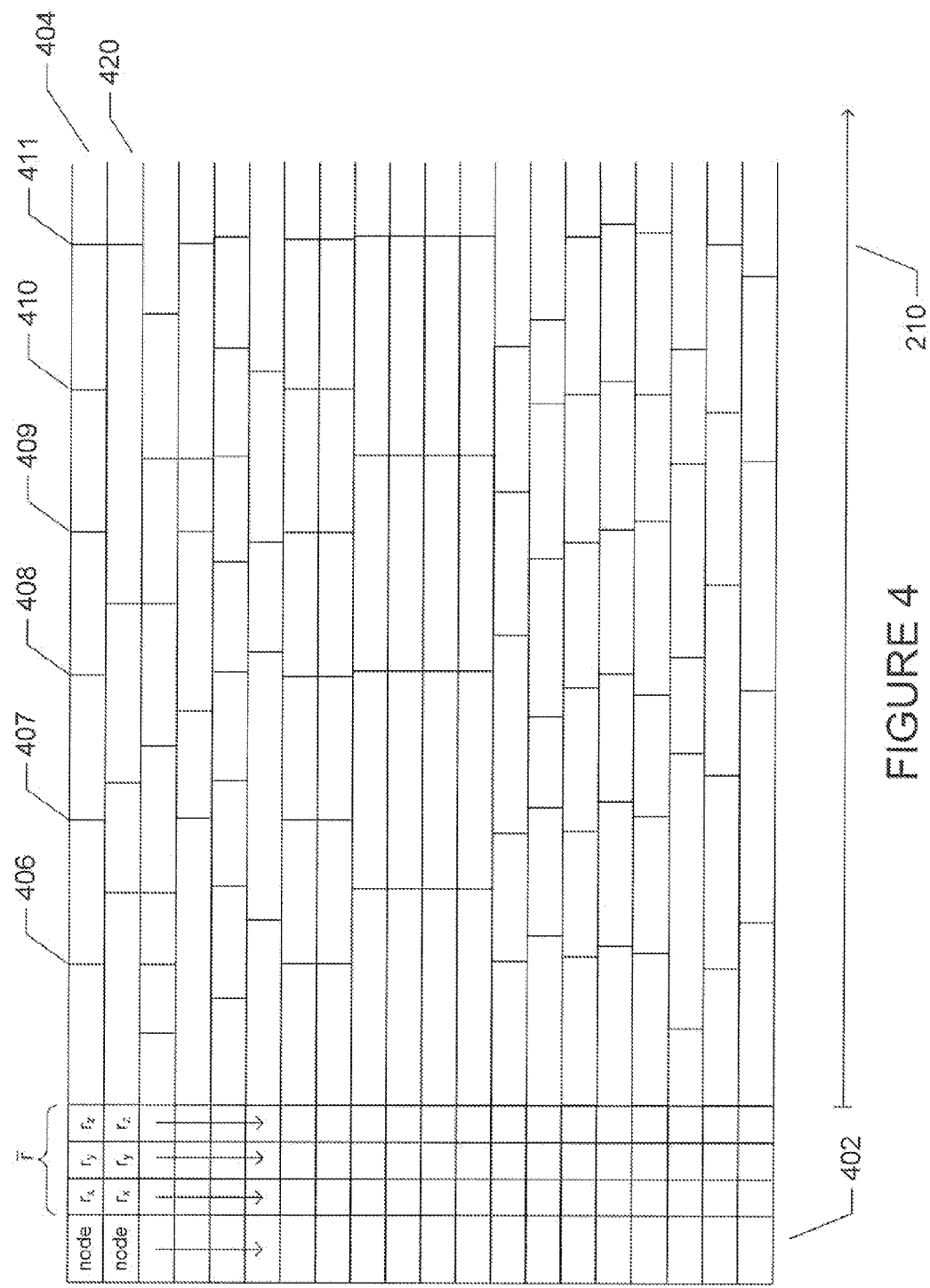
FIG. 4 illustrates data collection and transmission from the distributed-sensor network shown in FIG. 1 using slightly different illustration conventions than employed in FIG. 2.

FIG. 4 illustrates data collection and transmission from the distributed-sensor network shown in FIG. 1 using slightly different illustration conventions than employed in FIG. 2. As in FIG. 2, a table-like left-hand portion of FIG. 4 (402 in FIG. 4) includes a list of sensors, or nodes, along with representation of the position of each node. However, the data output from each sensor is represented as a series of digitally encoded data chunks that are transmitted at various points in time. For example, the sequence of data chunks that represents data output from the first node, in row 404, are recorded and transmitted by the first node to the sensor router at time points 406-411, which are spaced along the horizontal time axis 210 at a regular, or fixed, displacement or interval. By contrast, the data chunks for the second node, represented by row 420, are transmitted at irregular time points.

In FIG. 4, the time axis may be considered to be the time represented by a system clock within the sensor router. In other words, time, in FIG. 4, is shown from the perspective of the sensor router. In certain distributed-sensor networks, the sensors may have local clocks and may receive regular time-synchronization signals from the sensor router. In other types of distributed-sensor networks, the sensors may not be synchronized with respect to time. In certain applications, sensors may acquire and record data over fixed intervals, and transmit the most recently collected data to the sensor router at fixed points in time. Alternatively, the sensor router may poll sensors for data at regular intervals. In yet alternative applications, data transmission by sensors may be triggered by any of various events, such as discontinuities or spikes in the signals recorded by the sensors. Thus, in a general case, as shown in FIG. 4, the duration over which a next data transmission has been recorded by a sensor may vary and the times at which data is transmitted by sensors to the sensor router may vary.

For the purpose of discussion of the present invention, the data chunks transmitted by a sensor to the sensor router, as shown in FIG. 4, correspond to data messages transmitted by sensors to the sensor router or, in alternative implementations, directly to the data-storage and signal-processing facility. A data message thus corresponds to a digitally encoded block of data that includes sensor data recorded over some period of time and that is additionally packaged for transmission to a data-receiving entity, such as a sensor router or data-storage and signal-processing facility, by including data-message-transmission-protocol information, often in a header prepended to the encoded data.

Figure 5:
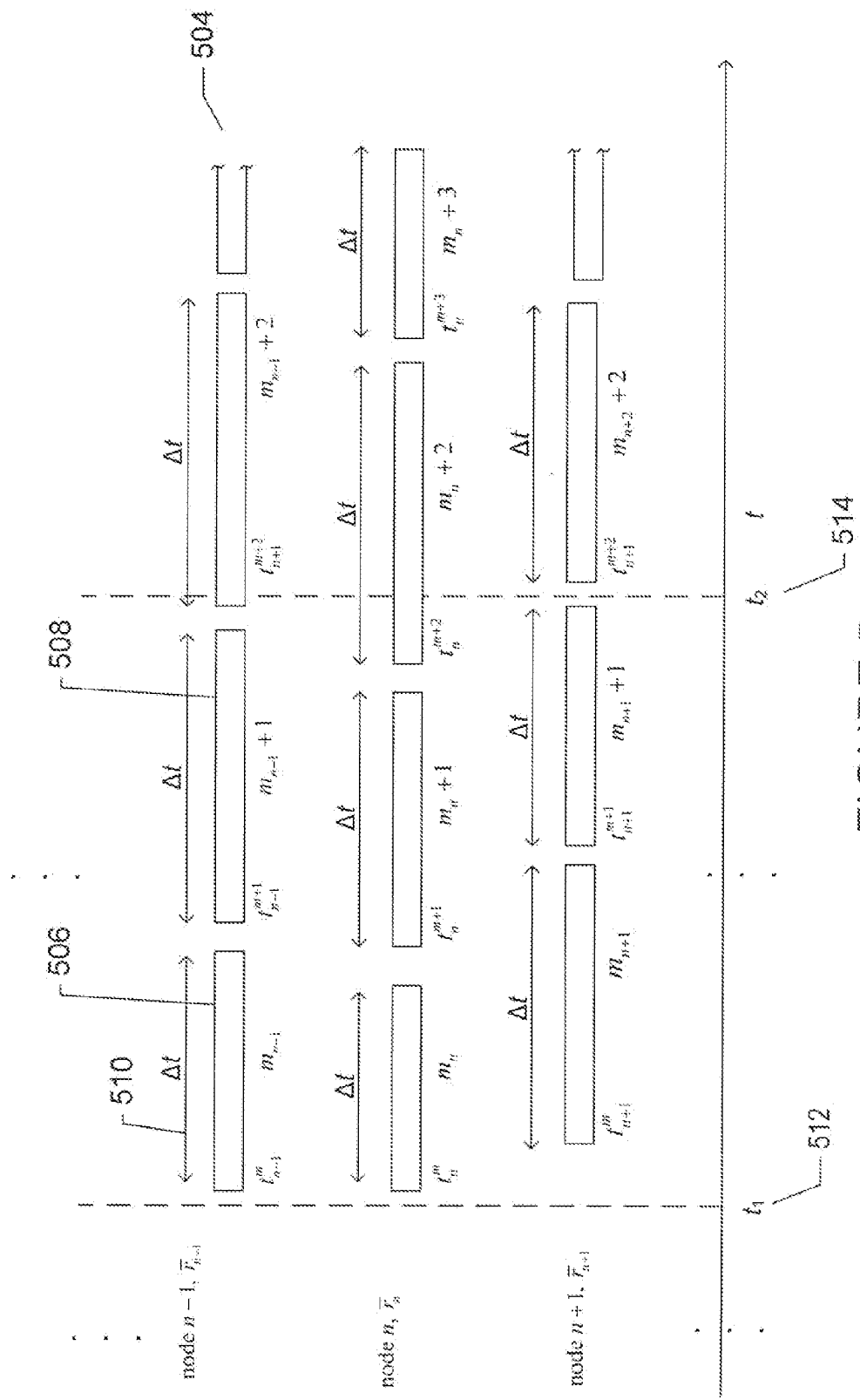
FIG. 5 illustrates processing of received messages by a sensor router or a remote data-storage and signal-processing facility.

FIG. 5 illustrates processing of received messages by a sensor router or a remote data-storage and signal-processing facility. As shown in FIG. 5, the receiving entity, for the purposes of discussion considered to be a sensor router, continuously receives messages from each of a number of nodes. As in FIGS. 2 and 4, FIG. 5 is annotated with a horizontal time axis 502 to indicate the progression of time. Each row of data chunks, such as row 504 in FIG. 5, represents the data-message output from a particular node within a distributed-sensor network. In the example distributed-sensor network of FIGS. 1-5, the nodes are presumed to be located at fixed positions, and are thus characterized by a number or name and a position vector r of the node with respect to some reference point, with the components of the position vector $r_x$, $r_y$, and $r_z$ corresponding to the three-dimensional Cartesian coordinates for the sensor. Furthermore, for each node, the messages are assumed to be sequenced and uniquely identified by sequence numbers with respect to the data-message output of the node. Thus, for example, the sequence of messages shown in row 504 represents the data output of a node n−1, having a corresponding position vector of $r_{n-1}$, with the first data message shown in FIG. 5 for node n−1 having the sequence number $m_{n-1}$ 506, the second message in the sequence for node n−1 having the sequence number $m_{n-1}+1$ 508, and so forth. Each data message may be associated with a time interval over which the data encoded within the message was recorded as well as an additional reference time, such the time at which the data was encoded, the time at which the data message was transmitted, the time at which data encoded within the message was begun to be recorded, or another such reference time. In FIG. 5, the time duration over which the data was recorded is indicated by double-headed, horizontal arrows, such as arrow 510, and a reference time for the message is represented by the notation $t_n^m$, where m is the sequence number of the message and n is the number, or name, that uniquely defines the node within a distributed-sensor network.

In FIG. 5, two time points $t_1$ 512 and $t_2$ 514 represent boundaries of a time interval over which the sensor router has received messages from distributed-sensor-network nodes for forwarding to a remote data-storage and signal-processing facility. The time interval may have a fixed duration, may be determined based on the occurrence of events and/or a running total of the amount of data received from the nodes, or may be determined by other means. During any particular time interval, a node may have transmitted, and the sensor router received from that node, no data messages, one data message, or more data messages.

As discussed above, either distributed-sensor-network nodes or the sensor router may compress the data in each message in order to decrease data-transmission overheads and associated data-transfer delays and to save power. However, compression of individual messages may fail to take advantage of a large amount of data redundancy present in multiple messages that can be detected and reduced by compression when multiple messages are compressed together. Certain examples of the present invention identify and reduce or remove various types of data redundancies in data transmitted from multiple data sources, such as multiple nodes of a distributed-sensor network. For example, in a distributed-seismic-sensor network, in which data collected from multiple sensors following test explosions are used to construct maps of subterranean features, sensors located near one another may respond similarly to a given test explosion. Thus, were the encoded data generated by the sensors collocated within a region aggregated and the multiple data streams compressed together, the redundant data across similarly responding sensors could be removed to produce much smaller compression ratios than can be produced by individual compression of messages transmitted from each source. As another example, a distributed-sensor network may include a number of different types of sensors, each type of sensor producing similar encoded signals in response to globally sensed events within the distributed-sensor network. In this case, aggregation of data transmission from the sensors of each type may provide an opportunity for identifying and removing, by compression, a great deal of data redundancy due to the similarity in encoded signals produced by sensors of each type.

Figure 6A:
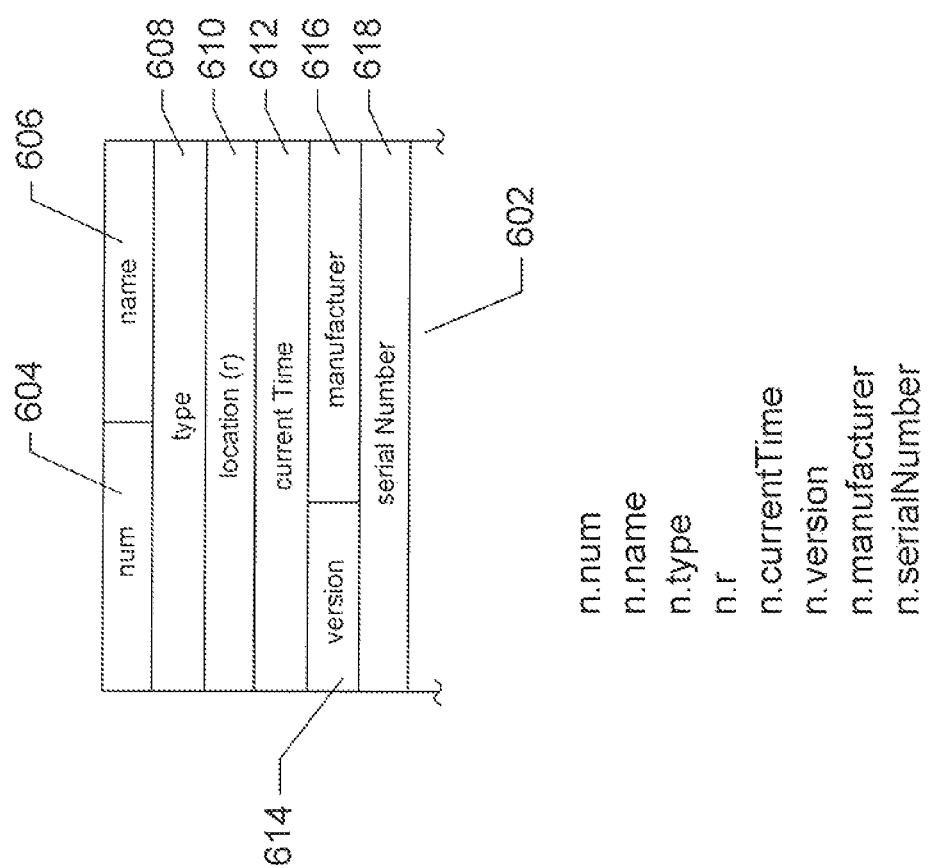
FIGS. 6A-B illustrate the types of information that may be encoded to describe nodes within a distributed-sensor network and messages transmitted by nodes to a sensor router or other remote entity according to one embodiment of the present invention.
Figure 6B:
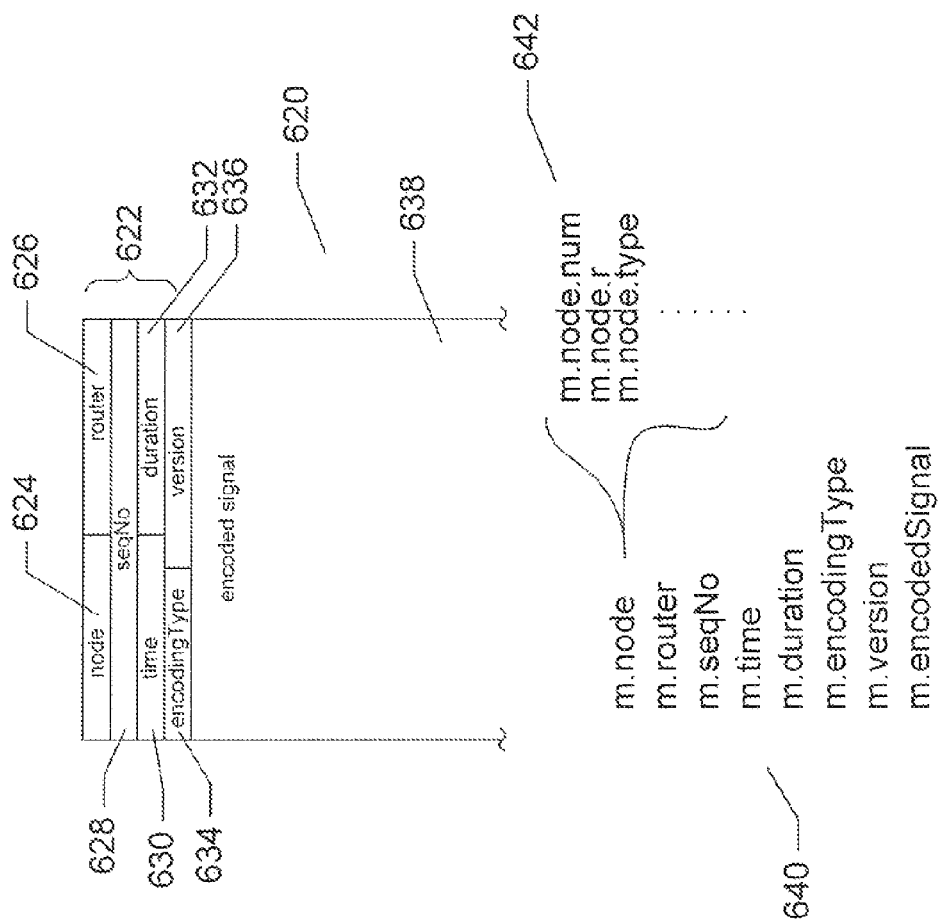

FIGS. 6A-B illustrate the types of information that may be encoded to describe nodes within a distributed-sensor network and messages transmitted by nodes to a sensor router or other remote entity according to one embodiment of the present invention. FIGS. 6A-B also illustrate notation used in subsequent discussion of examples of the present invention with respect to the information encoded to describe nodes and messages. FIG. 6A illustrates data that may be stored, within a data structure, or record, to describe a particular node within a distributed-sensor network. The data may include a unique identifying number for the node 604 within a distributed-sensor network, a unique name for the node 606 within the distributed-sensor network, a symbolic representation of the type of the node 608, a digitally encoded position vector or Cartesian coordinates for the location of the node 610, particularly in the case of fixed-position nodes, an indication of the current time reported by the node during a most recent synchronization exchange 612, an indication of the version of the node 614, an indication of the manufacturer of the node 616, and a globally-unique serial number for the node 618. In various applications of distributed-sensor networks, nodes may be characterized by fewer fields than the fields shown in the data structure 602 of FIG. 6A, and, in alternative applications, may be characterized by a greater number of fields and attributes. FIGS. 6A-B are intended to provide an example of the types of information that may be encoded to describe nodes and data messages. Each field of the data structure 602 may be referenced using the C-like or C++-like notation shown below the data structure in FIG. 6A, where, for example, the notation "n.num" refers to the num data field of the data structure corresponding to node n.

FIG. 6B illustrates, using the same illustration conventions as used in FIG. 6A, data that may be associated with, or contained within, a data message. Certain portions of this data may be included in a header appended to data within the message and may also be stored along with the data of a message upon reception of the message by a sensor router or data-storage and signal-processing facility. The message 620 may include a header 622 that contains the following data fields: (1) node, a numeric or alphanumeric identifier of the distributed-sensor-network node that transmitted the message 624; (2) router 626, an address or encoded designation of the sensor router to which the message is transmitted; (3) seqNo 628, a sequence number that uniquely identifies a message within the stream of messages transmitted by the node identified by the node field 624; (4) time 630, a reference time associated with the message, such as the time that recorded data was encoded into the message, the time that the message was sent, or some other reference time; (5) duration 632, an indication of the length of time over which the data transmitted within the message was recorded; (6) encoding type 634, an indication of how the data was encoded to produce the digitally encoded data included in the message; and (7) version 636, an additional indication of how the data was encoded. Finally, the encoded data 638 is included in the data message. As with the node data structure discussed with reference to FIG. 6A, the message data structure can be described using the C-like and C++-like notation 640. Note that fields of the sending node may be described by prepending the message-relative indication of the node, "m.node," to the name of data fields within the node-describing data structure. For example, the notation "m.node.num" 642 references the num field 604 of the data structure 602 associated with the node described by field 624 of the message m.

Figure 7A:
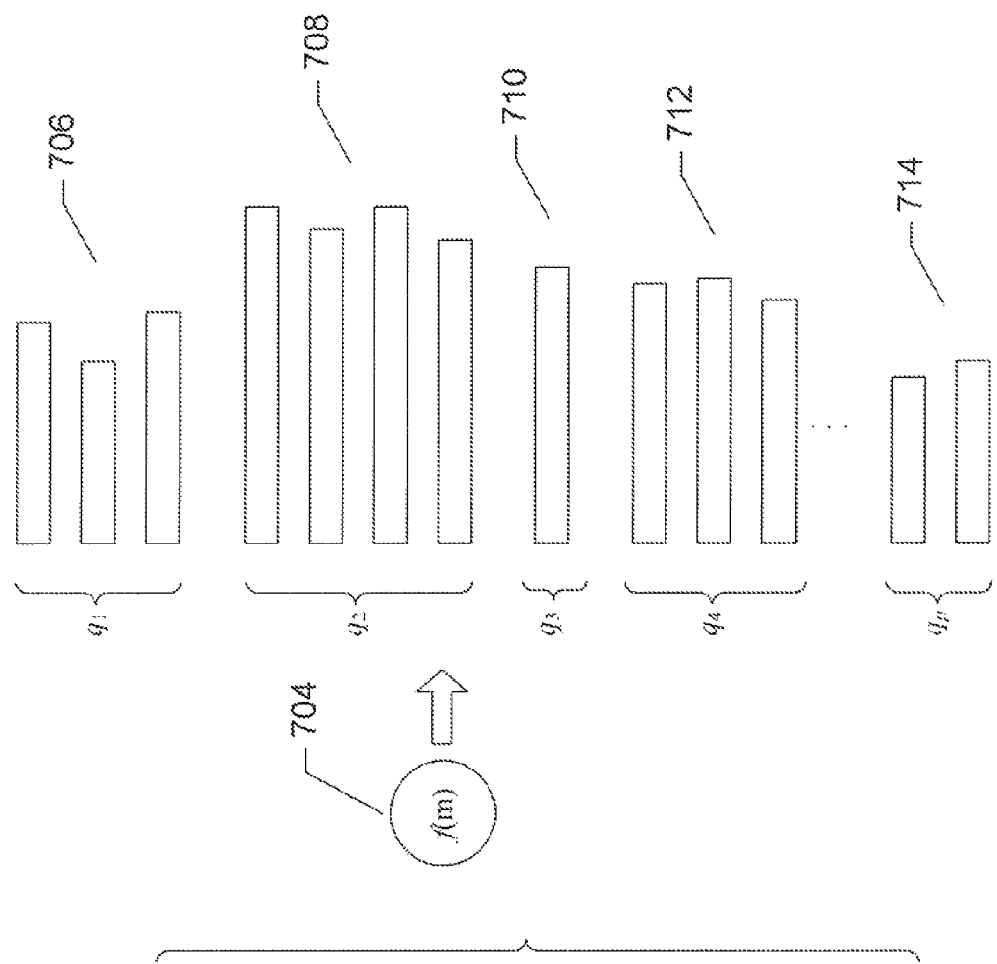
FIGS. 7A-B illustrate a message-partitioning function that is used to partition aggregated messages from multiple data sources into message partitions according to one embodiment of the present invention.

FIGS. 7A-9I illustrate one approach used in certain embodiments of the present invention to aggregate messages from multiple sources, such as from multiple sensors of a distributed-sensor network, identify data redundancy across the messages from multiple sources, and compress the multiple messages together to remove the redundancy to obtain smaller compression ratios than can be obtained by only individually compressing messages. FIGS. 7A-B illustrate a message-partitioning function that is used to partition aggregated messages from multiple data sources into message partitions according to one embodiment of the present invention. In FIG. 7A, a left-hand column of messages 702 represents an aggregated set of messages received from multiple data sources within a time interval by a message recipient, such as a sensor router that forwards messages from sensors of a distributed-sensor network to a data-storage and signal-processing facility. For example, the messages in column 702 of FIG. 7A may correspond to messages received by a sensor router during a time interval, such as the time interval indicated by times $t_1$ 512 and $t_2$ 514 in FIG. 5. In an initial step of multiple-data-source compression, a partitioning function $f(m)$ 704 is applied to each message m in the aggregated messages 702 in order to partition the messages into a set of message partitions Q, where the set of message partitions Q includes, as shown in FIG. 7A, P message partitions $q_1$ 706, $q_2$ 708, $q_3$ 710, $q_4$ 712, and $q_P$ 714, along with an unspecified number of additional partitions in the sequence of message partitions between partition $q_4$ and $q_P$. The partitioning function $f(m)$ 704 is generally application specific. The partitioning function seeks to partition the messages into groups of related messages, with the relatedness expressed as an amount of shared redundancy among the messages. Subsequently, as discussed below, the messages within each partition are compressed together in order to remove the shared redundancy among the messages and produce relatively low compression ratios. For any given time interval, there may be no messages, one partition of messages, or multiple partitions of messages.

Figure 7B:
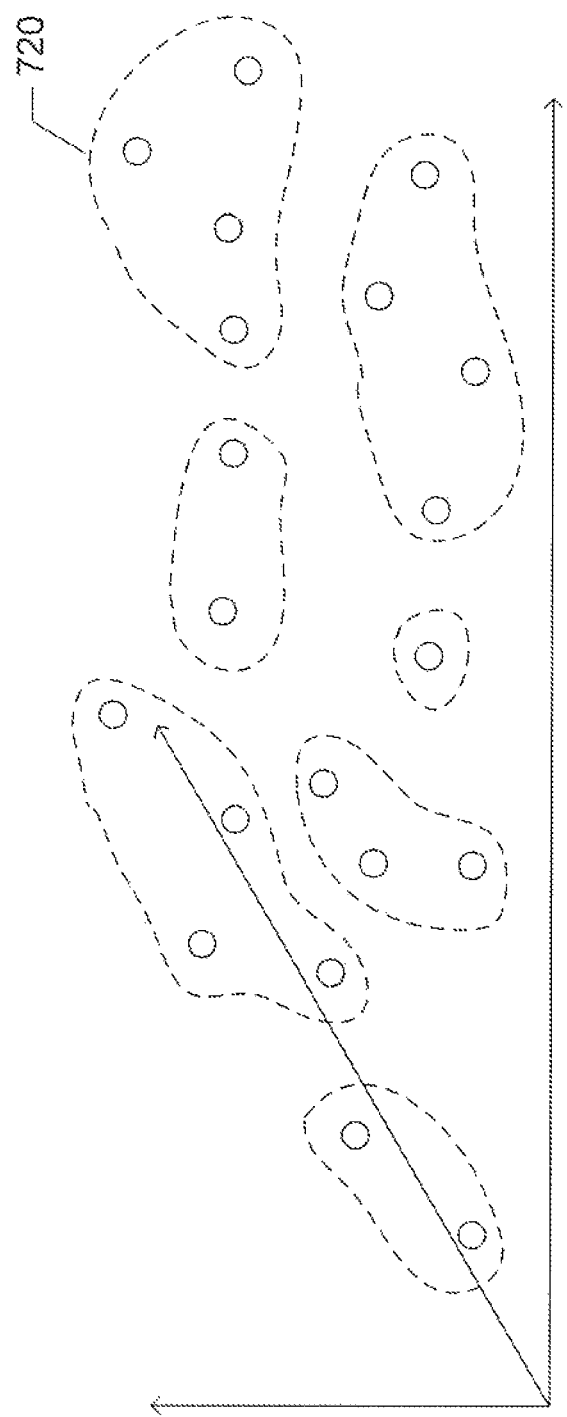

FIG. 7B illustrates, using the distributed-sensor network discussed with reference to FIG. 1, one possible partitioning function. In FIG. 7B, partitioning is carried out by grouping together sensors that are close to one another in position. In FIG. 7B, the partitions are indicated by closed dashed curves, such as closed dashed curve 720. Many other types of partitioning functions may be devised, on an application-specific basis, in order to group together the messages of sensors most likely to contain large amounts of common, redundant data. In many cases, the partitioning function may consider multiple criteria. For example, a related partitioning function to the geographic partitioning shown in FIG. 7B may partition sensors with respect to distance from one another as well as with respect to sensor type. Each partition would include messages transmitted from sensors of a particular type that are also closely positioned relative to one another. Partitioning functions may also employ historical or training data in order to determine groups of sensors likely to produce messages with common redundant data during subsequent operation. Message partitioning may further take into account characteristics of various events with respect to which sensors record and encode data, environmental conditions, the time of day, and many other factors in order to most nearly optimize message partitioning so that the greatest possible amount of redundant data can be identified and removed by compressing together the messages of each partition.

Figure 8A:
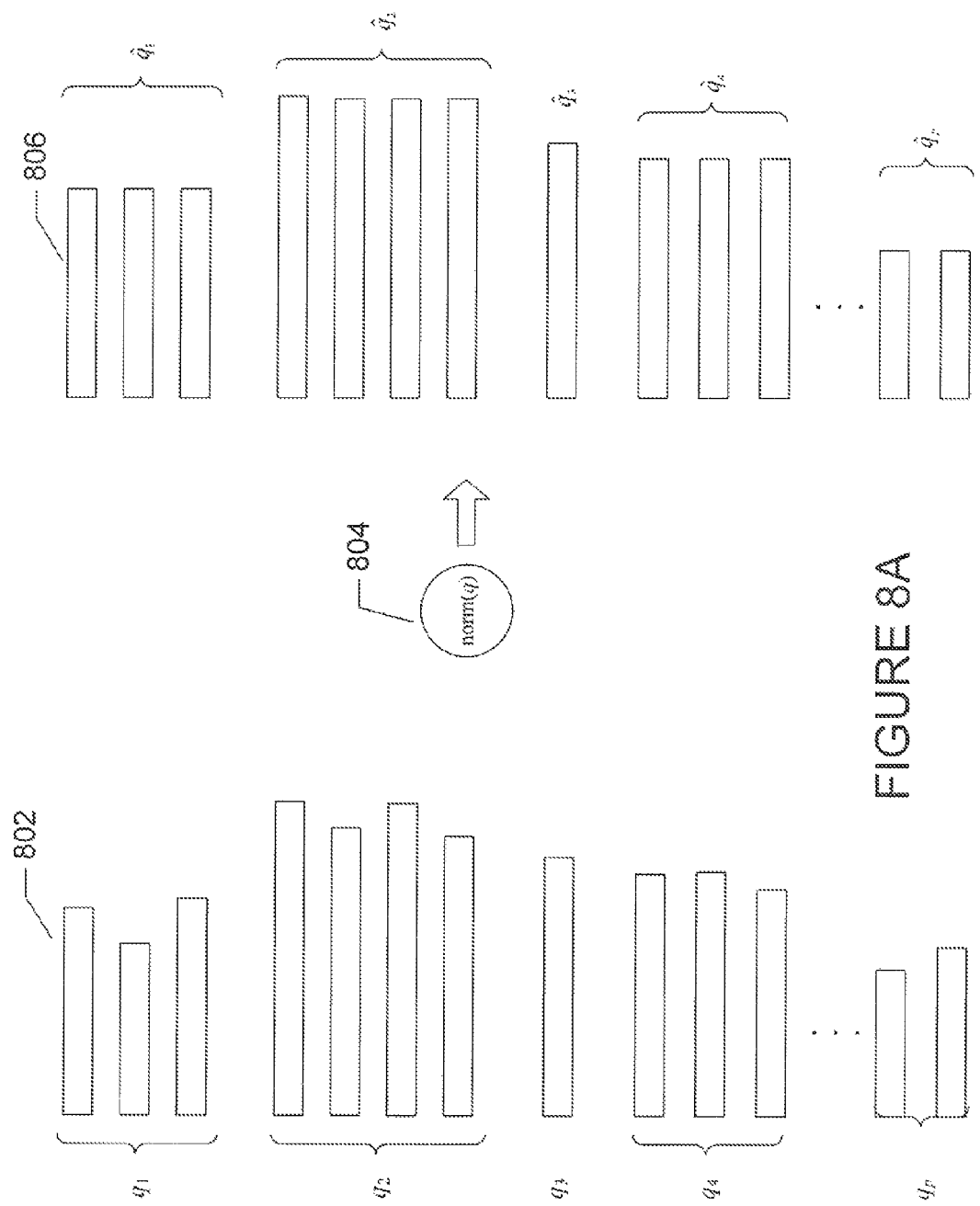
FIGS. 8A-C illustrate signal normalizing methods according to one embodiment of the present invention.
Figure 8B:
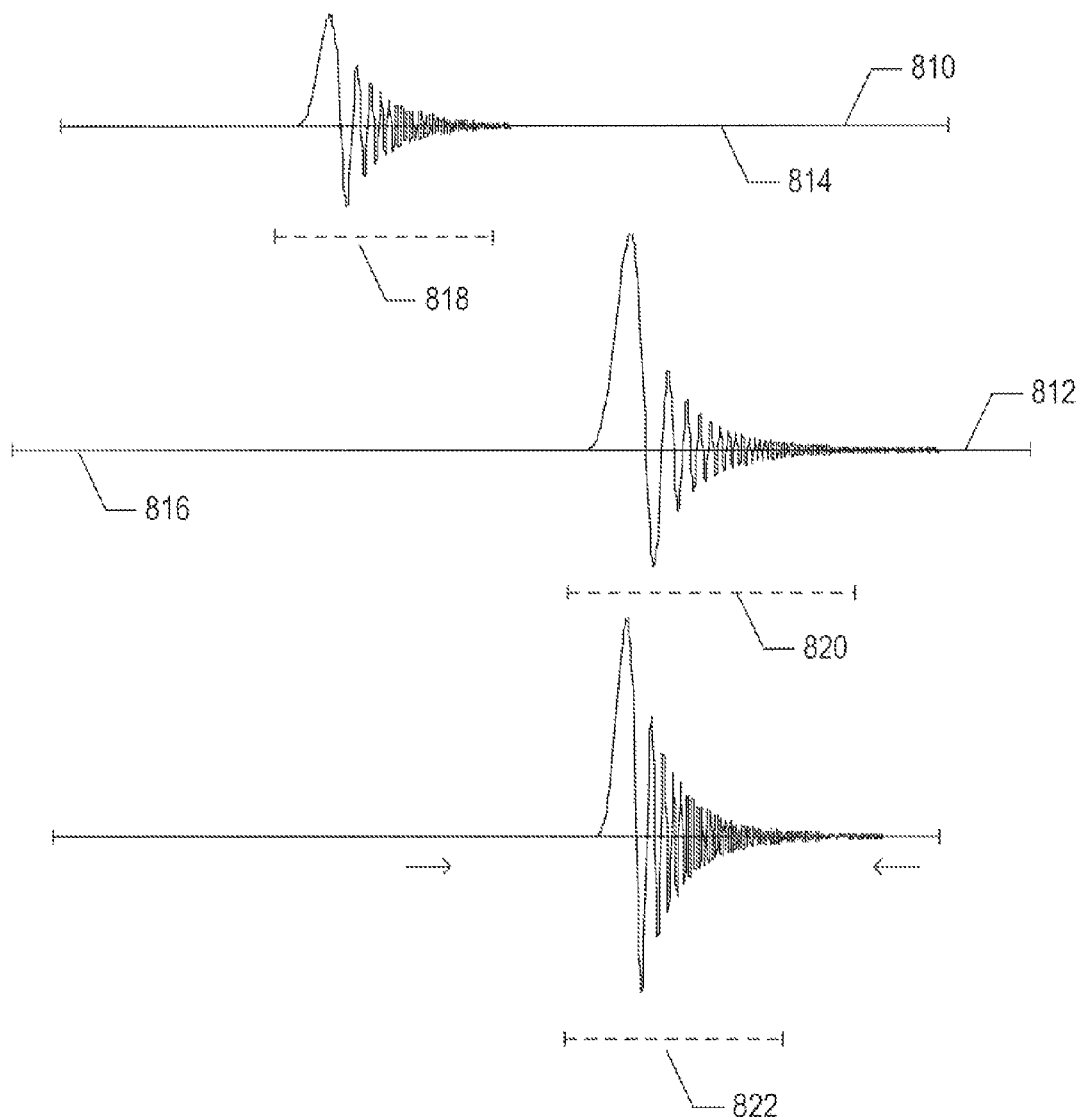
Figure 8C:
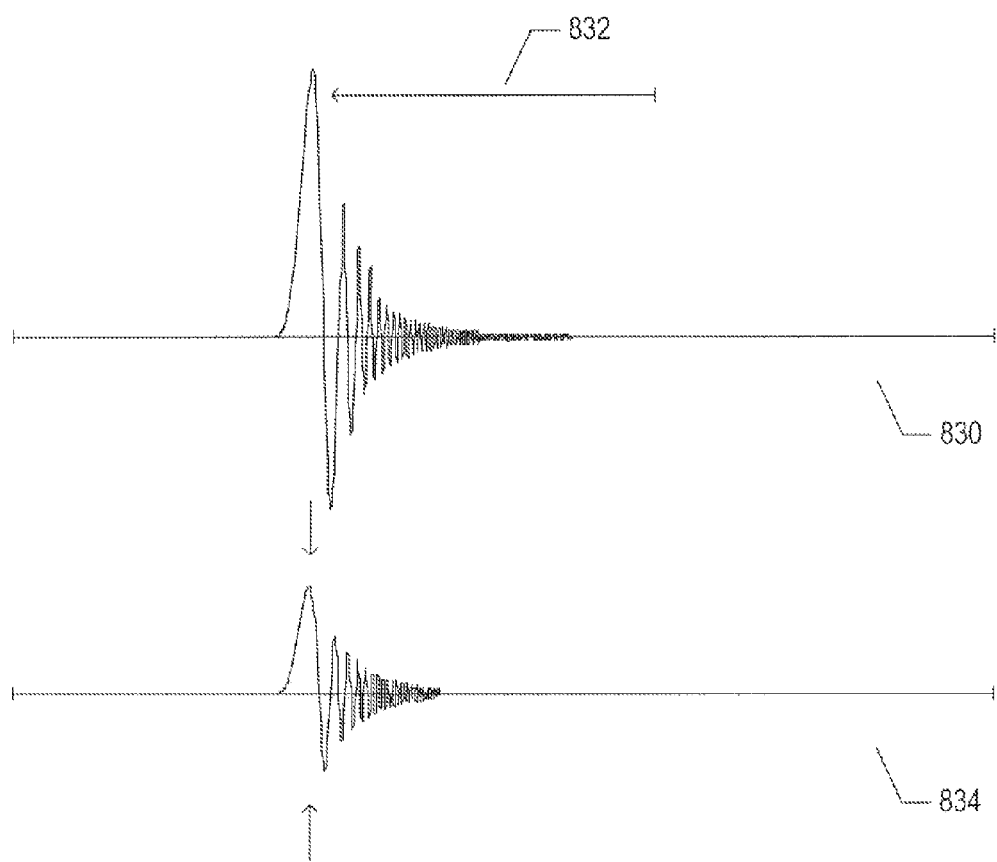

Signal normalization represents a second step that may be undertaken, following message partition, to prepare for compression of each message partition by a sensor router or data-storage and signal-processing facility. FIGS. 8A-C illustrate signal normalizing methods according to one embodiment of the present invention. In FIG. 8A, the P message partitions $q_1, q_2, \ldots, q_P$ are shown in the left-hand column 802. A normalization function 804 is applied to each message partition in order to normalize messages within each partition relative to one another, producing normalized partitions $\hat{q}_1, \hat{q}_2, \ldots, \hat{q}_P$ shown in the right-hand column 806. The normalization function may take into account various types of transformations that increase the likelihood of identifying and removing redundant data among the messages in each partition. FIGS. 8B-C illustrate one example of signal normalization. In FIG. 8B, an illustration of the signal encoded within a first message 810 and a signal encoded within a second message 812 within a data-message partition is shown. The length of the horizontal axis 814 and 816, in both cases, represents the duration of time over which the signal was recorded by the respective sensors. As can be seen in FIG. 8B, characteristics of the wave forms of the two signals are different. The durations of the two signals 818 and 820 have different lengths, the maximum amplitudes of the signals differ, and the period of oscillation in the signals also differs. Such differences may reflect actual differences in the physical stimulus eliciting signal response in the two sensors or may arise from differences in the sensor instrumentation, internal timing, and signal encoding. For example, the sensor that recorded the second signal 812 may have more sensitive instrumentation than the sensor that recorded signal 810. Similarly, the sensor clocks may have different frequencies, and sensors may sample and record data at different rates based on the differing clocks. Whether due to difference in the physical stimulus or differences in the sensors, a series of normalization steps can be used to transform one or more signals encoded with the messages of a partition in order to maximize opportunity for identifying and removing redundant information. In a first transformation, the second signal is resampled, in time, so that the duration of the transformed signal 822 is the same as that of the first signal 810. Next, as shown in the first displayed signal 830 in FIG. 8C, the second signal is shifted in time 832 so that the maximum positive peak of the second signal corresponds to the same point in time as the maximum peak of the first signal 810. Finally, as shown in the final displayed signal 834 in FIG. 8C, the second signal is scaled, by a multiplication factor, so that the maximum peak height of the second signal is the same as the maximum peak height of the first signal 810 in FIG. 8B. Of course, the translations applied to each signal in order to carry out normalization need to be recorded and added to header information accompanying the encoded signal so that the original signals corresponding to all messages within each partition can be reconstructed by a receiver of the compressed messages following decompression.

Figure 9A:
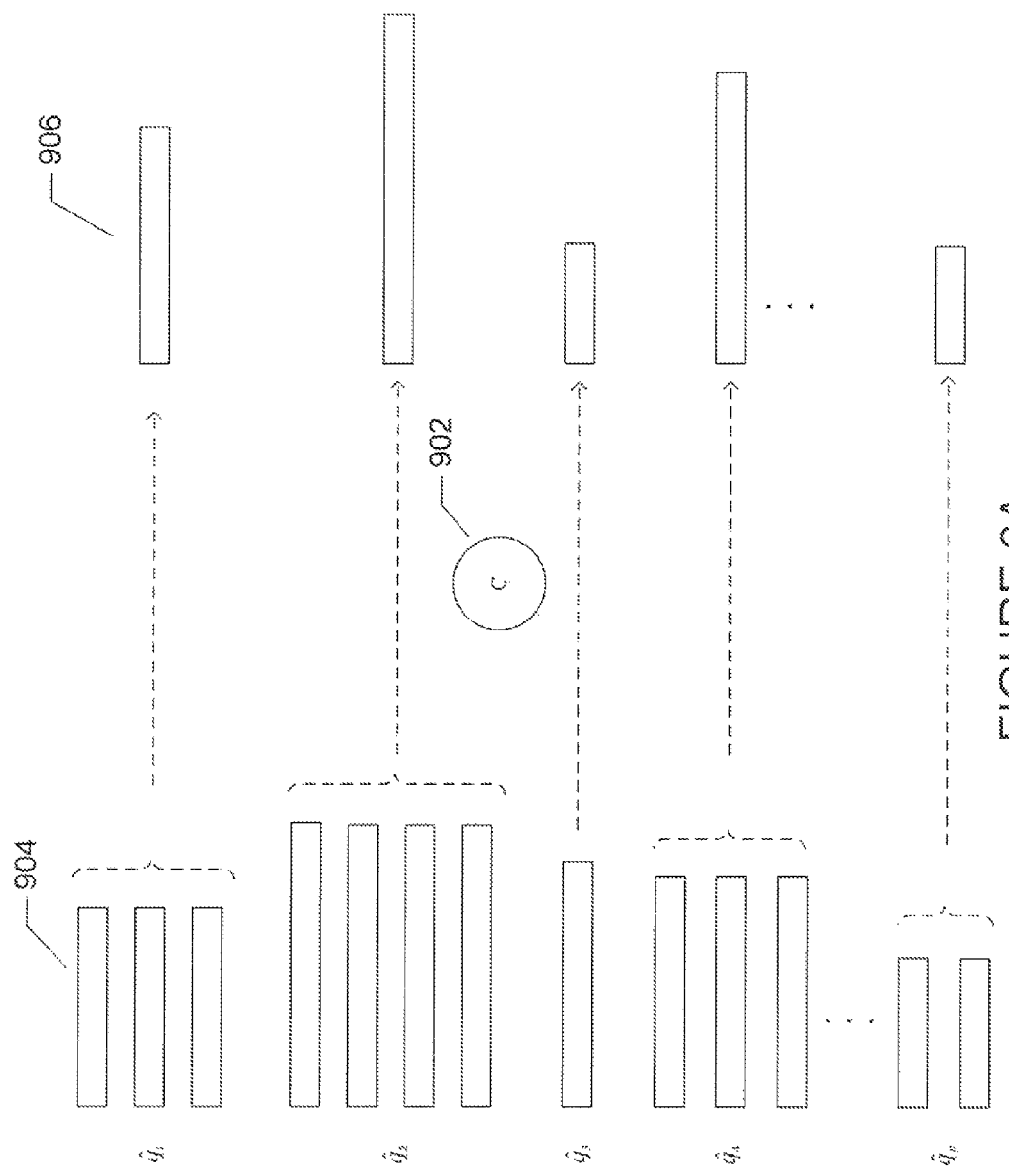
FIGS. 9A-I illustrate general compression of data messages within a message partition and compression of transmitted signals from sensors within a distributed-sensor network according to one embodiment of the present invention.

Finally, the messages in each message partition are compressed together in order to identify and remove common data redundancies shared among the messages. FIGS. 9A-I illustrate general compression of data messages within a message partition and compression of transmitted signals from sensors within a distributed-sensor network according to one embodiment of the present invention. As shown in FIG. 9A, a compression function 902 is applied to each of the normalized partitions shown in the left-hand column of message partitions 904 in FIG. 9 to produce compressed output, shown in the right-hand column 906 of FIG. 9 corresponding to each message partition.

One dimensional signals, such as a signal generated and digitally encoded by a single sensor node, can be compressed by applying any of a large number of one-dimensional compression methods, many of which include steps of sampling and analog-to-digital conversion, scalar quantization, and entropy coding. In addition, as discussed below, two-dimensional compression methods may be employed to compress two-dimensional data, such as the signals generated by multiple nodes within a node partition following normalization and alignment. Many different two-dimensional-data-compression approaches, such as methods developed for compressing photographic images, can be applied to compress normalized and aligned signals generated by multiple nodes in a given partition. In general, the messages within the partitions are, following normalization and alignment, ordered to facilitate identification and removal of as much commonly shared redundant data as possible. Ordering places similar signals close to one another, so that inter-signal redundancy can be detected and removed. As one example, the JPEG-LS technique, or similar two-dimensional compression techniques, may be used to carry out lossless compression of two-dimensional data. JPEG-LS uses differential pulse code modulation ("DPCM") to encode differences, using Golomb-like encoding techniques, between predicted values for data, based on preceding data in the two-dimensional data set, and observed values for the data. A traversal is made, in two dimensions, of the data, with predictions made for subsequent data in the traversal based on preceding data in the traversal. When the prediction methods effectively recognize data redundancies along the traversal path, the encoded differences between predicted and observed data are generally small, and thus the DPCM method serves a similar purpose as the discrete cosine transform in lossy JPEG compression.

In the following discussion, two-dimensional compression is carried out on normalized and aligned signals from multiple nodes, organized logically as a column of one-dimensional sensor signals, as in FIGS. 2 and 4. A horizontal, first direction within the two-dimensional data corresponds to a time dimension for each sensor signal, and a vertical, second direction within the two-dimensional data corresponds to the direction in which signals from different sensors are stacked upon one another, as in FIGS. 2 and 4. In many cases, two-dimensional coding is most effective, for compressing data from multiple sensors, when the one-dimensional data from the sensors is first ordered, with respect to the vertical direction, so that similar one-dimensional signals are grouped together within the two-dimensional data to provide for maximum predictability of subsequent data from each point along the traversal path. Presumably, after normalization and alignment, the signals generated by nodes within a partition are related to one another with respect to the horizontal direction, as shown in FIG. 2, since the signals are generally responses to a common event or common environmental conditions. Thus, vertical ordering ensures maximal predictability in two dimensions.

Figure 9B:
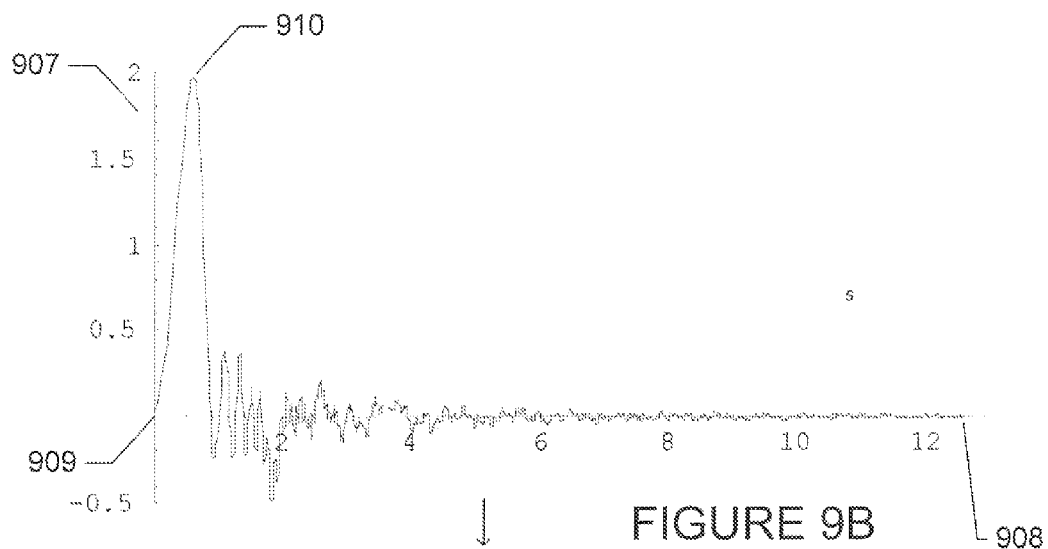
Figure 9C:
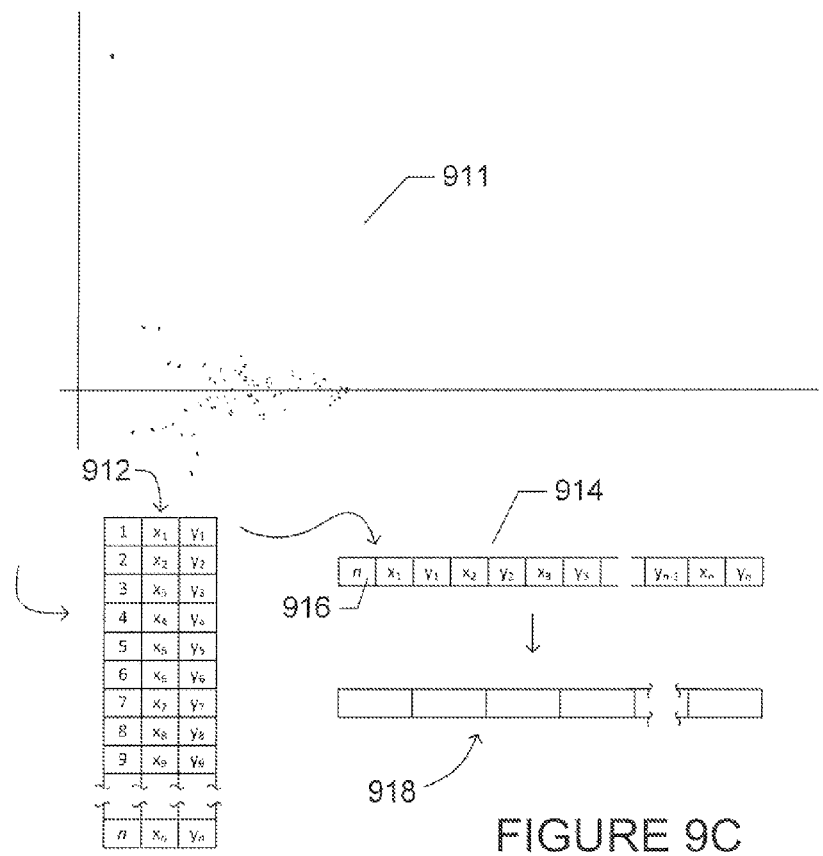
Figure 9D:
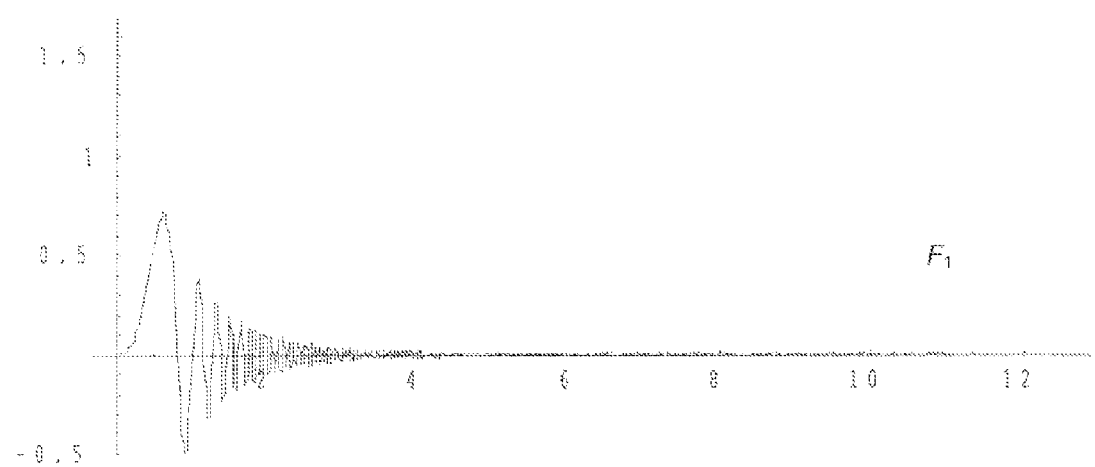
Figure 9E:
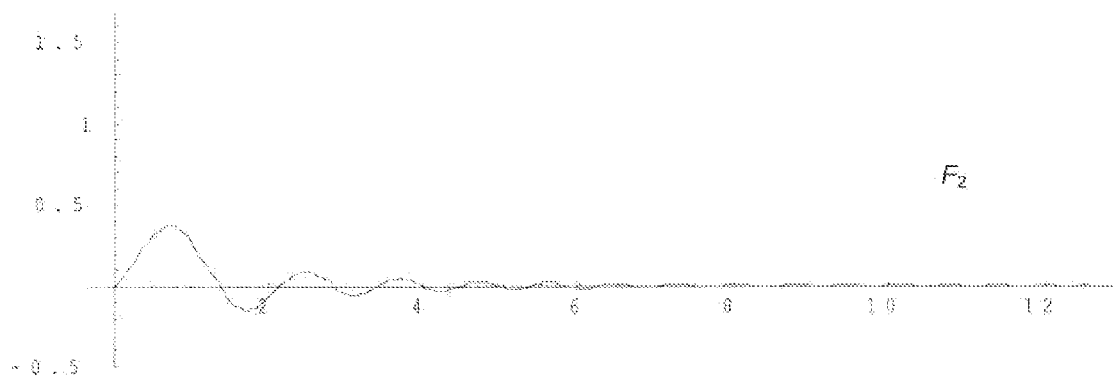
Figure 9F:
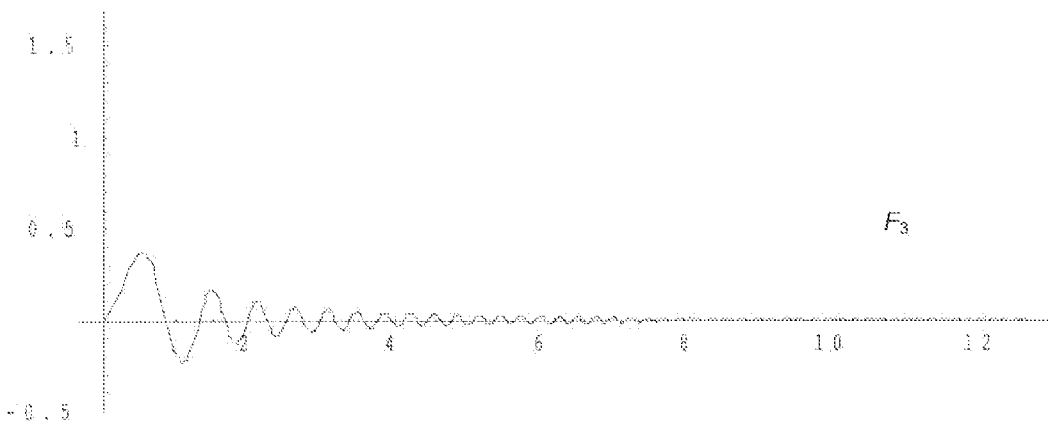
Figure 9G:
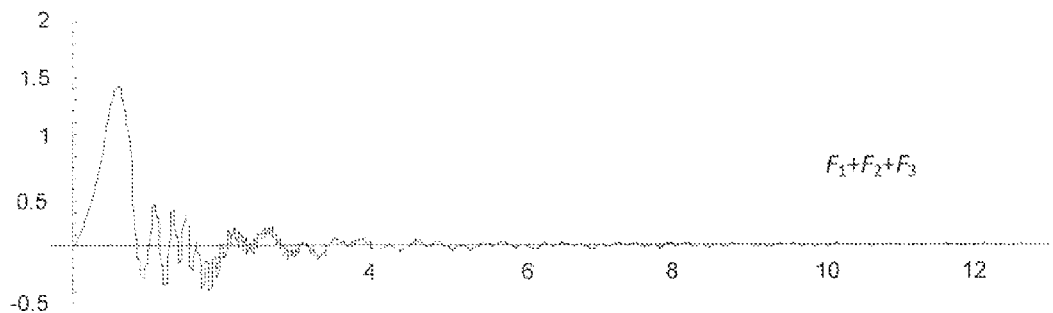

FIGS. 9B-C illustrate a signal encoding technique used by a sensor node to encode and transmit its data to a sensor router. FIG. 9B shows a signal recorded by a hypothetical sensor in response to an event. The signal might be, for example, the acceleration along one axis of a multi-axis accelerometer. The hypothetical signal could represent any of various other types of responses from other types of sensors to various types of events. The signal, shown in FIG. 9B, is represented as a plot of some type of detected physical characteristic, such as acceleration with respect to a frame of reference or change in three-dimensional position, plotted with respect to a vertical axis 907, over time, plotted with respect to the horizontal axis 908. Following occurrence of an event, at time 0 (909 in FIG. 9B), the signal rapidly reaches a maximum 910 and then oscillates at lower amplitudes, with amplitude decreasing rapidly over time.

A first technique for encoding and compressing the signal, represented in FIG. 9B, is to generate a table of amplitudes at each of a large number of time points in order to discretize, in time, the continuous signal. This step includes quantizing real-number-valued signal amplitudes in order to represent the real-valued amplitudes as digitally-encoded values, such as finite-precision floating-point numbers. The table can then be encoded in a string of characters or symbols, and the character string can be compressed by any of various types of data-compression techniques, including various types of entropy encoding. Additional compression can be obtained by truncating the signal at some time following which the signal does not again reach a threshold amplitude. Both discretization and truncation represent lossy compression.

A second technique for encoding the signal, as shown in FIG. 9C, is to first compute the local minima and maxima points along the signal, as shown in graph 911, where the local minima and maxima correspond to the highest points of positive peaks and the lowest points of negative peaks in the signal. Then, finite precision floating-point representations of the positions of the local minima and maxima can be encoded in a table 912 from which a formatted symbol string 914 can be generated, the symbol string including a first entry 916 indicating the number of coordinate pairs for local minima and maxima and the remaining symbols constituting coordinate pairs for the local minima and maxima, in time order, with truncation at a time following which the signal curve remains below a positive amplitude threshold and above a negative amplitude threshold. Finally, the formatted symbol string 914 may be encoded, by various types of compression techniques, including entropy-encoding compression techniques, to produce a compressed string 918 equivalent to the symbol string 914. The compression illustrated in FIG. 9C is also an example of lossy compression. Decompression of the compressed symbol string would first carry out entropy decoding to produce character string 914, and then use any of various curve-fitting techniques to fit a continuous curve to the minimum and maximum points encoded in the character string.

FIGS. 9D-H provide a third example of single-source data compression of the signal represented by the continuous curve in FIG. 9B. It may be the case that the detected signal can be decomposed into a number of component wave forms. For example, the functions $F_1$, $F_2$, and $F_3$, plotted in graphs shown in FIGS. 9D-F, when added together, produce the function plotted in the graph shown in FIG. 9G. Comparison of this graph to the original signal, shown in FIG. 9B, reveals that the sum of the three functions $F_1$, $F_2$, and $F_3$ produces a wave form similar to the signal wave form. The wave form shown in FIG. 9G can be scaled, by multiplication, to best fit the form of the original signal, shown in FIG. 9B, and then a difference wave form can be computed as:

$$D=S-(F_1+F_2+F_3)$$

where D is a difference signal;
S is the original signal; and
$F_1$, $F_2$, and $F_3$ are parameterized functions.

Figure 9H:
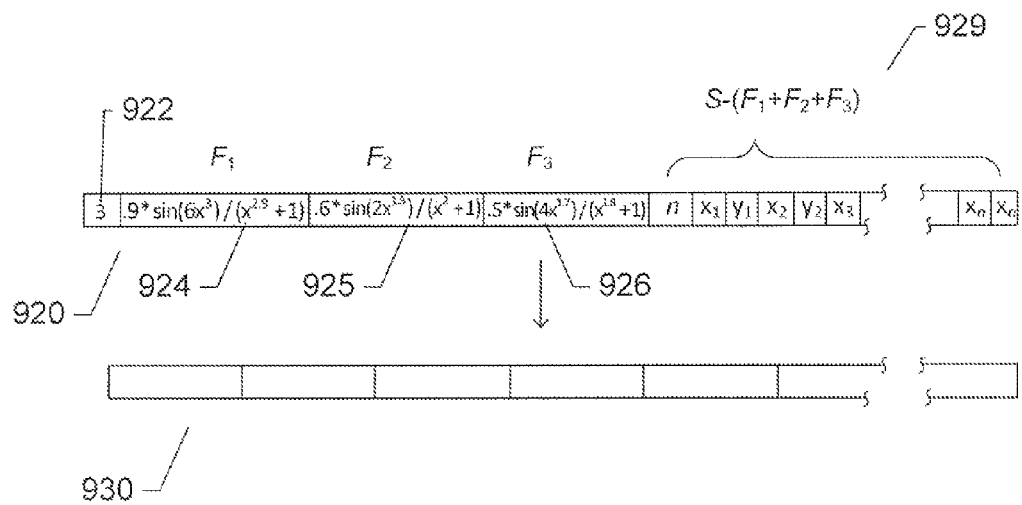

When the sum of the component functions is sufficiently close, in form, to the original signal, the difference signal may have relatively low amplitude, and may quickly dampen, over a relatively short period of time, to insignificance, and thus can be largely truncated for compression purposes. In that case, as shown in FIG. 9H, the original signal may be encoded in a symbol string 920 including a first entry 922 indicating the number of component functions, entries for representing the component functions 924-926, followed by an encoding of the difference function D using the technique discussed above with reference to FIG. 9C, 929. This symbol string 920 can then be further compressed using entropy coding or other compression techniques to produce a final encoded signal 930.

When single-data-source data compression techniques are employed, according to any of many well-known single-data-source data compression techniques, including those discussed above with reference to FIGS. 9C-9H, each individual sensor can compress a signal or set of signals recorded by the sensor and transmit the compressed signal to a sensor router or remote computer system. The N sensors of the distributed-sensor network may record some amount of data and then compress the data by any of many well-known single-source-data-compression techniques, to produce compressed data. On average, the sensors of the distributed sensor-network achieve an effective compression rate of:

$$\bar{c}_r = \frac{n\bar{c}}{n\bar{u}} = \frac{\sum_{i=1}^{n} c_i}{\sum_{i=1}^{n} u_i}$$

where n is number of sensors;
$c_i$ is the size of the compressed data for sensor i;
$u_i$ is the size of the uncompressed data for sensor i;
$\bar{c}$ is the average size of the compressed data for the sensors;
$\bar{u}$ is the average size of the uncompressed data for the sensors; and
$\bar{c}_r$ is an average compression ratio for the sensor network.

The average compression ratio $\bar{c}_r$ is most applicable to a distributed-network system in which the sensors are similar and respond similarly to detected events. The average compression ratio may be, for example, the compression ratio obtained by any of the single-data-source data-compression methods, discussed with reference to FIGS. 9C-H, within a distributed-sensor network where the sensors respond similarly to detected events.

Method and system embodiments of the present invention are directed to multiple-source data compression. As one example of multiple-source data compression, a sensor router may accumulate or receive data from the N sensors, partition the received data, or messages, into P message partitions, and compress the data massages in each partition, together, in order to benefit from inter-sensor-data redundancy. In order to describe one example of a multi-source data-compression method that represents an example implementation of the present invention, various simple notational conventions are next described. First, the sensors in a distributed-sensor network are described as a set of sensors:

$$S = \text{set of sensors} = \{S_n\}$$

where $n \in [1, 2, \ldots, N]$; and
each sensor $S_n$ is associated with an identifier $S_a$.num and a position $S_n.r=(r_x,r_y,r_z)$ Thus, the distributed-sensor network includes N sensors, each designated $S_n$, where n is the index, or label, of a particular sensor.

In the context in which one example of the present invention is described, each sensor generates one or more messages during a time interval. It is assumed, for the distributed-sensor network S, that there is a partitioning function that generates a value v for any sensor/event combination:

$$v = f(m)$$

where v is a number that represents the relatedness of message m to other messages As one example, in a distributed-seismic-sensor network, the function $f(\ )$ may compute a distance between the sensor source of a message and the location of a test explosion. In a more complex distributed-seismic-sensor network, the function $f(\ )$ may take into account not only the distance between a particular sensor and the explosion, but also may take into account some known or dynamically determined characteristics of the local site of the sensor.

Figure 9I:
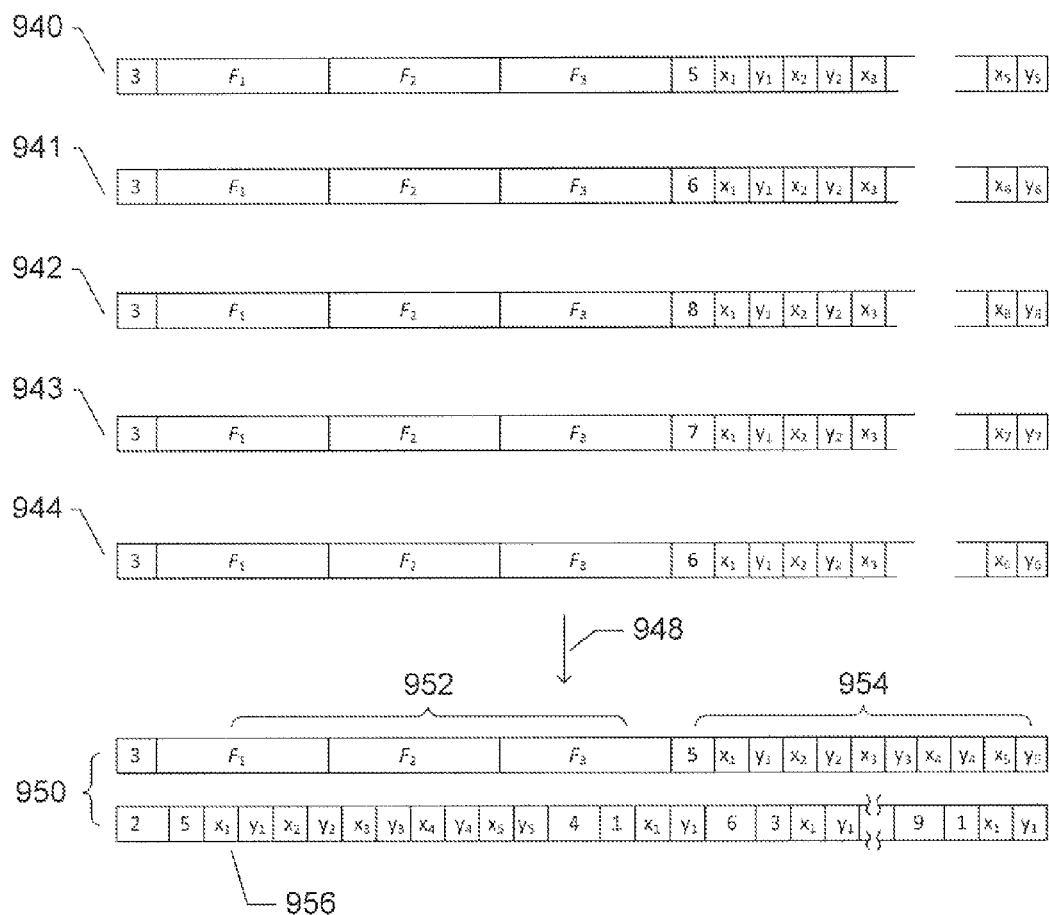

All of the messages generated within a time interval of interest can be partitioned into a set of message partitions Q:

$$Q = \text{set of message partitions} = \{q_1\} \text{ where } i \in [1, \ldots, P]$$

where each message partition $q_i$ is associated with a different value nq returned by message-partitioning function $f(\ )$ and
message partition $q_i$=set of messages=$\{m_k\}$ where $k \in [1, \ldots, K_i]$ FIG. 9I shows one example of a multiple-data-source data-compression technique based on the single-data-source data compression approach illustrated in FIGS. 9B-H that represents one example of the present invention. In FIG. 9I, all five sensors of a particular sensor partition produce encoded symbol strings 940-944 similar to the encoded symbol string 920 in FIG. 9H. However, rather than employing entropy encoding separately on each encoded symbol string, all five symbol strings can be merged and compressed, as indicated by arrow 948 in FIG. 9I, to produce an aggregate encoded symbol string 950 that contains the same information as contained in the five individual symbol strings 940-944, but using far fewer symbols than the sum of the number of symbols in each of the symbol strings 940-944. For example, it may be the case that the three component functions $F_1$, $F_2$, and $F_3$ are identical for all five sensors in the partition, arising from the fact that the sensors respond similarly to a particular event. Thus, rather than repeatedly copying the symbolic representations of these three functions, the symbolic representations of the three functions are included once 952 in the aggregate encoded symbol string. It may also be the case, as an example, that the first five difference-function maxima and minima are identical for all five, sensors, and thus the first five maxima and minima may be included once 954 in the aggregate encoded symbol string. Then, the maxima and minima following the first five maxima and minima are included for each of the five sensors in the remaining portion 956 of the aggregate encoded symbol string. The aggregate encoded symbol string can then be further compressed using a general compression technique, such as an entropy-encoding compression technique.

Consider the compression ratio achieved in the multiple-data-source data-compression method of the present invention discussed with reference to FIG. 9I:

$$c_r = c_e \frac{sizeof(\text{aggregate symbol string})}{\sum_{i=1}^{n} u_i} \overline{c}_r = c_e c_{agg} \overline{c}_e$$

where $c_r$ is compression ratio;
n is number of sensors;
$u_i$ is the size of the uncompressed data for sensor i;
$c_e$ is the compression ratio for entropy coding;
$c_{agg}$ is the compression ratio for aggregation of the symbol strings; and
$\overline{c}_c$ is the average compression ratio for encoding a sensor signal in a symbol string.

The total compression ratio is the product of three different compression ratios, all having, in one case, values less than 1. The product of compression ratios $c_c$ and $\overline{c}_c$ of the multiple-data-source data-compression method may be similar, in value, to the average compression ratio $\overline{c}_r$ of the single-data-source data-compression methods discussed above with reference to FIGS. 9C-H, and thus the multiple-data-source data-compression method achieves greater compression than independent data compression by data sources by a factor equal to the additional compression ratio that results from aggregating the individual symbol strings (948 in FIG. 9I) to produce an aggregate symbol string.

The two-dimensional compression discussed above with reference to FIG. 9I is one simple example of a two-dimensional compression method for compressing data generated by multiple sensors. The JPEG-LS-based methods and related methods, discussed above, are anticipated to be of greater practical utility, in many cases, and to have greater general applicability to data generated from various different types of sensors.

Figure 10A:
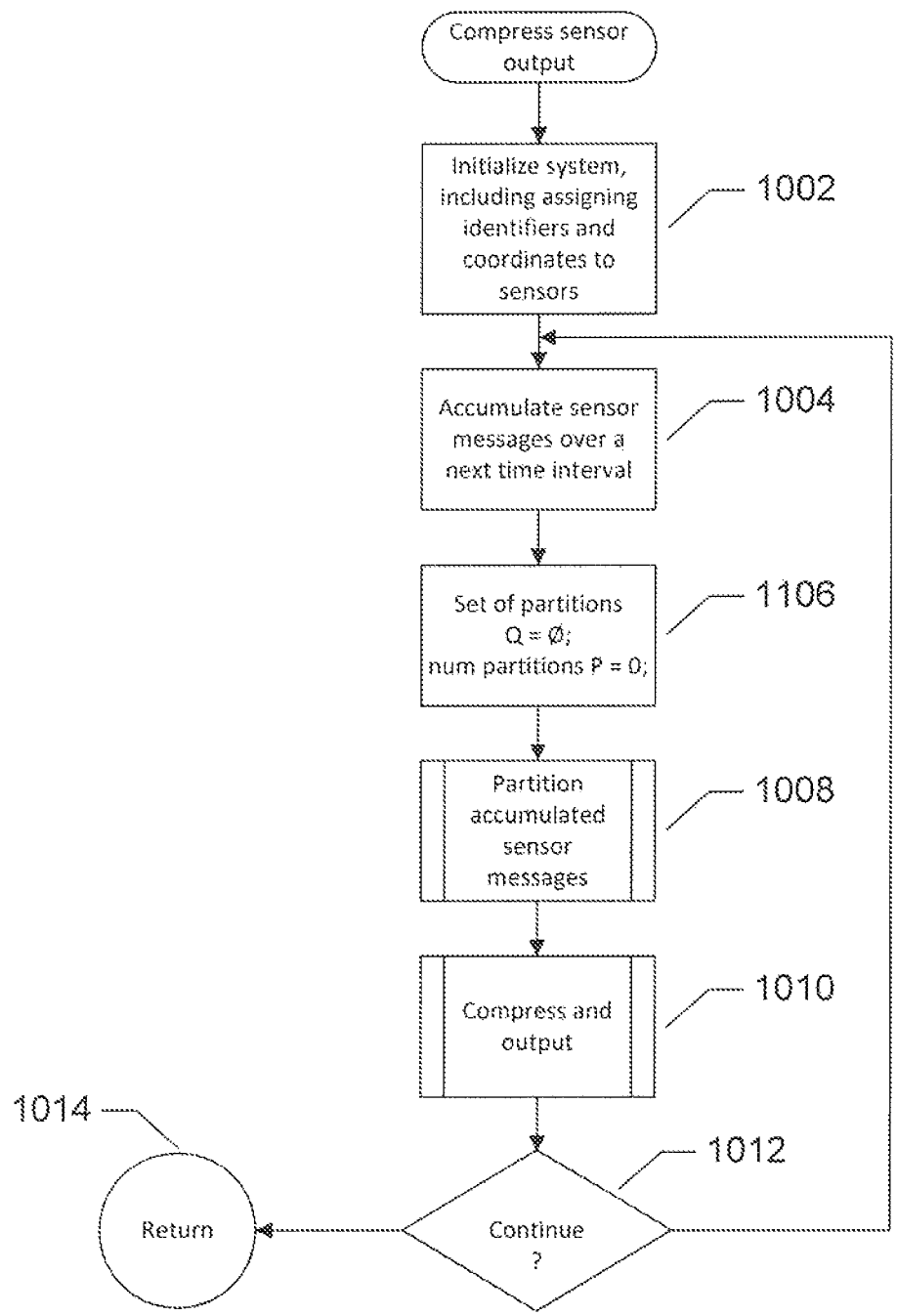
FIGS. 10A-C provide control-flow diagrams for one multiple-data-source data-compression method that represents one embodiment of the present invention.
Figure 10B:
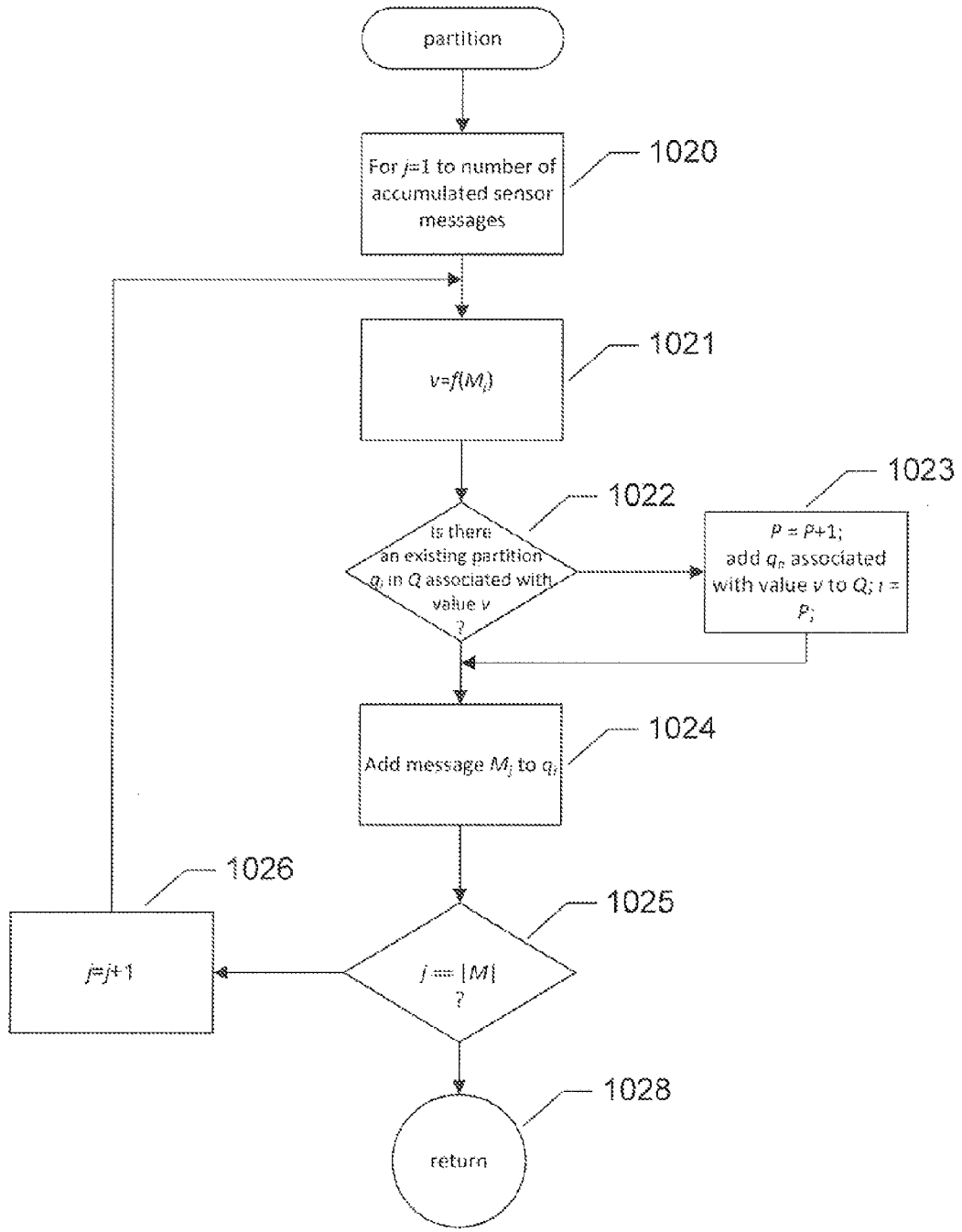
Figure 10C:
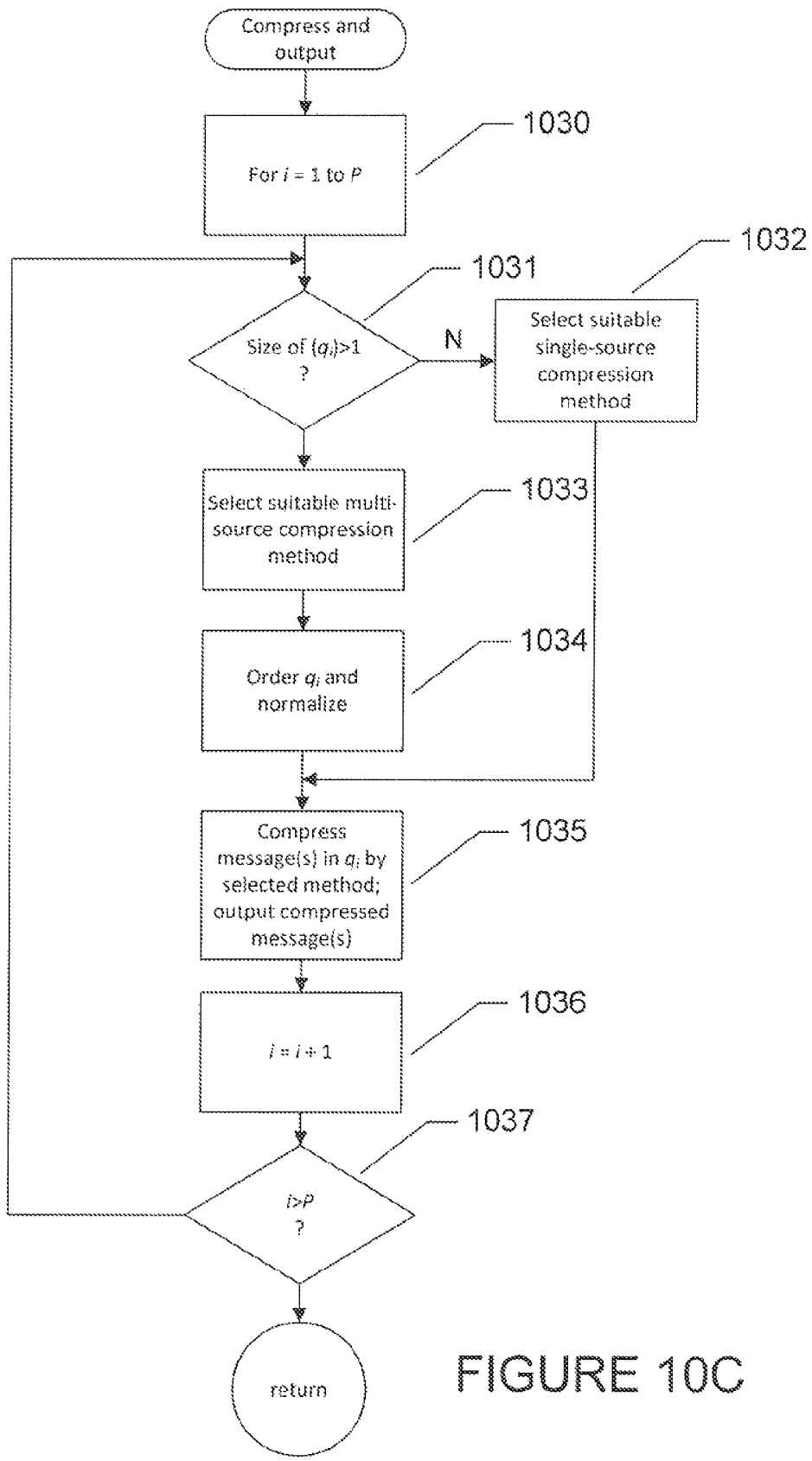

FIGS. 10A-C provide control-flow diagrams for one multiple-data-source data-compression method that represents one embodiment of the present invention. In this method, multiple-data-source data compression is carried out for each of a consecutive sequence of time intervals within a distributed-sensor network. The method, described with reference to FIGS. 10A-C, partitions messages generated by data sources into message partitions, and compresses the messages in message partitions together to remove inter-message redundancies. The partitioning is based on a relatedness value returned by a partitioning function, as discussed above with reference to FIG. 7A.

First, in step 1002 of FIG. 10A, the distributed-sensor network is initialized, which includes assigning identifiers and coordinates to each of the sensors, establishing communications links between sensors and routers or remote computer systems, and other such initialization and configuration operations for the distributed-sensor network and higher-level processing components. In step 1004, messages from sensors are accumulated over a next, currently considered time interval. In step 1006, the set of partitions Q is initialized to the null set and index P is set to 0. Then, the routine "partition accumulated sensor messages" is called in step 1008 to partition the accumulated sensor messages. In step 1010, the routine "compress and output" is called to compress all of the messages in each partition and output the compressed messages. When further time intervals are to be considered, as determined in step 1012, control flows back to step 1004. Otherwise, the continuous multiple-data-source data-compression method terminates at step 1014.

FIG. 10B provides a control-flow diagram for the routine "partition accumulated sensor messages" called in step 1008 of FIG. 10A. In the for-loop of steps 1020-1026, each message of the accumulated messages is considered. In step 1021, the relatedness value v is computed for the currently considered sensor message by applying the partitioning function $f(\ )$ discussed above with reference to FIG. 7A, to the message. In step 1022, the routine "partition" determines whether or not there is a message partition $q_i$ associated with the computed value v. If not, then in step 1023, the index P is incremented and a new message partition is added to Q associated with the relatedness value v. In step 1024, the currently considered message is added to the message partition $q_i$ associated with the relatedness value v. The for-loop continues, with increment of loop variable j in step 1026, until the index j is equal to the number of accumulated messages, as determined in step 1025.

FIG. 10C provides a control-flow diagram for the routine "compress and output," called in step 1010 in FIG. 10A. In the for-loop of steps 1030-1037, the messages in each message partition $q_i$ are compressed. When the currently considered partition $q_i$ has a single member, as determined in step 1031, a suitable single-data-source data compression method is selected in step 1032. Otherwise, a suitable multiple-data-source data-compression method is selected in step 1033. In step 1034, the messages in the message partition $q_i$ are ordered and may be additionally normalized, as discussed with reference to FIGS. 8A-C. Message ordering may or may not be employed, depending on the multiple-data-source data-compression method selected. In step 1035, the messages in the partition $q_i$ are compressed using the selected single-source or multiple-data-source data-compression method. Various types of single-source, one-dimensional compression techniques and multiple-source, two-dimensional compression techniques that can be employed in this step are discussed above. In general, quantization and entropy coding, and other such techniques, can be applied to compress one-dimensional data and two-dimensional compression techniques, such as JPEG-LS coding, can be employed to compress two-dimensional data obtained by normalizing and aligning one-dimensional data from multiple sources. Then, the compressed message or messages is output. Output of the compressed message(s) may involve transmission of the compressed messages from a sensor router to a remote computer system, storage of the compressed messages by a remote computer system within a data-storage facility, such as internal or external mass-storage devices, or some other operation in which the compressed data is transmitted, stored, or processed.

The example implementation of one aspect of the present invention described in the control-flow diagrams of FIGS. 10A-C is applicable to a number of different contexts. Many additional, related implementations of aspects of the present invention are possible. For example, in the example of the present invention described in FIGS. 10A-C, sensor messages are accumulated within successive time intervals, partitioned, and compressed, when appropriate, by multiple-data-source data compression techniques. In alternative implementations, multiple-data-source data compression may be triggered by events, rather than being carried out over fixed time intervals. In alternative embodiments of the present invention, multiple-data-source data compression may be invoked based on the size of accumulated messages within the sensors of a distributed-sensor network. Many more applications for various multiple-data-source data-compression methods that represent examples of the present invention are possible.

Next, additional details are provided for the example, of the present invention, described with reference to FIGS. 10A-C, applied to a distributed-seismic-sensor network. In this context, pseudo code for the partitioning function $f( )$ which returns a value v, is provided below:

```
constant int Quant;
int f (message m, event e)
{
    float d = distance (m.node.r, e.r);
    return (int (d/Quant));
}
```

In this case, the relatedness of a message to a particular event, such as a test explosion, is the computed distance of the sensor source of the message to the position of the event divided by a constant "Quant." In alternative approaches, relatedness may additionally be computed based on the similarity of sensors, the historical similarity of sensor responses to particular types of events, and many other relatedness considerations.

As discussed above, for two-dimensional data compression, ordering of the signals generated by nodes in a partition with respect to the vertical direction can facilitate recognition and elimination of data redundancy. In the distributed-seismic-sensor-network context, a partition-ordering routine, used in step 1034 of FIG. 10C, is next provided:

```
void orderPartition (message* q_i, int M_i, event e)
{
    if (M_i<2) return;
    int j = random (1, M_i);
    message ref = q_i[j];
    message tmp;
    q_i[j] = q_i[1];
    q_i[1] = ref;
    bool switched = true;
    while (switched)
    {
        switched = false;
        for (m=2, n=3; m<M_i; m++, n++)
        {
            if (order (q_i[m], q_i[n], ref, e) < 0)
            {
                tmp = q_i[n];
                q_i[n] = q_i[m];
                q_i[m] = tmp;
                switched = true;
            }
        }
    }
}
```

The partitioning is carried out by simple sorting of the messages within a partition, where the relative ordering of any two messages with respect to a random, first message ref is determined via the function "order." A pseudo code implementation of the function "order" is next provided:

```
int order (message m_1, message m_2, message ref, event e)
{
    int d_1, d_2;
    int a_1, a_2;
    d_1 = distance (m_1.node.r, ref.node.r);
    d_2 = distance (m_2. node.r, ref. node.r);
```

```
    if (d_1 < d_2) return 1;
    else if (d_2<d_1) return -1;
    else
    {
        a_1 = angle (m_1.node.r, e.r, ref. node.r);
        a_2 = angle (m_2.node.r, e.r, ref. node.r);
        if (a_1<a_2) return 1;
        else if (a_2<a_1) return -1;
        else
        {
            if (m_1.name <= m_2.name) return 1;
            else return -1;
        }
    }
}
```

Thus, in the orderPartition routine, one message from the message partition is selected as the reference message, ref and the remaining messages of the partition are ordered following the message ref within the partition by a simple sorting method. The routine order receives, as arguments, two messages, $m_1$ and $m_2$, along with the reference message ref and an event e, returns a value 1 when message $m_1$ should be ordered before message $m_2$ and returns a value –1 when message $m_2$ should be ordered before message $m_1$. The ordering is primarily based on the relative distances of the sensors which generate messages $m_1$ and $m_2$ from the position of the sensor which generates the message ref. When these relative distances are the same, then a determination is made on the angles between a vector from the sensor position associated with the message $m_1$ or $m_2$ and the event position and a vector from the sensor position associated with message ref and the event position. Should these angles be the same for both messages $m_1$ and $m_2$, then a decision is made based on the lexicographic ordering of the names of messages $m_1$ and $m_2$.

Thus, multiple-data-source data compression can be applied to multiple discrete sources of data, such as a distributed-sensor network, in which elimination of significant inter-data-source data redundancies can lead to significant decrease in compression ratios. Multiple-data-source data compression may also be carried out for a single physical source, such as a single physical sensor, which produces multiple messages over time. In this case, messages produced at different times can be considered to be multiple data sources, and the multiple-data-source data-compression methods discussed above applied to remove redundant data across messages produced by the single physical source at different points in time.

Figure 11:
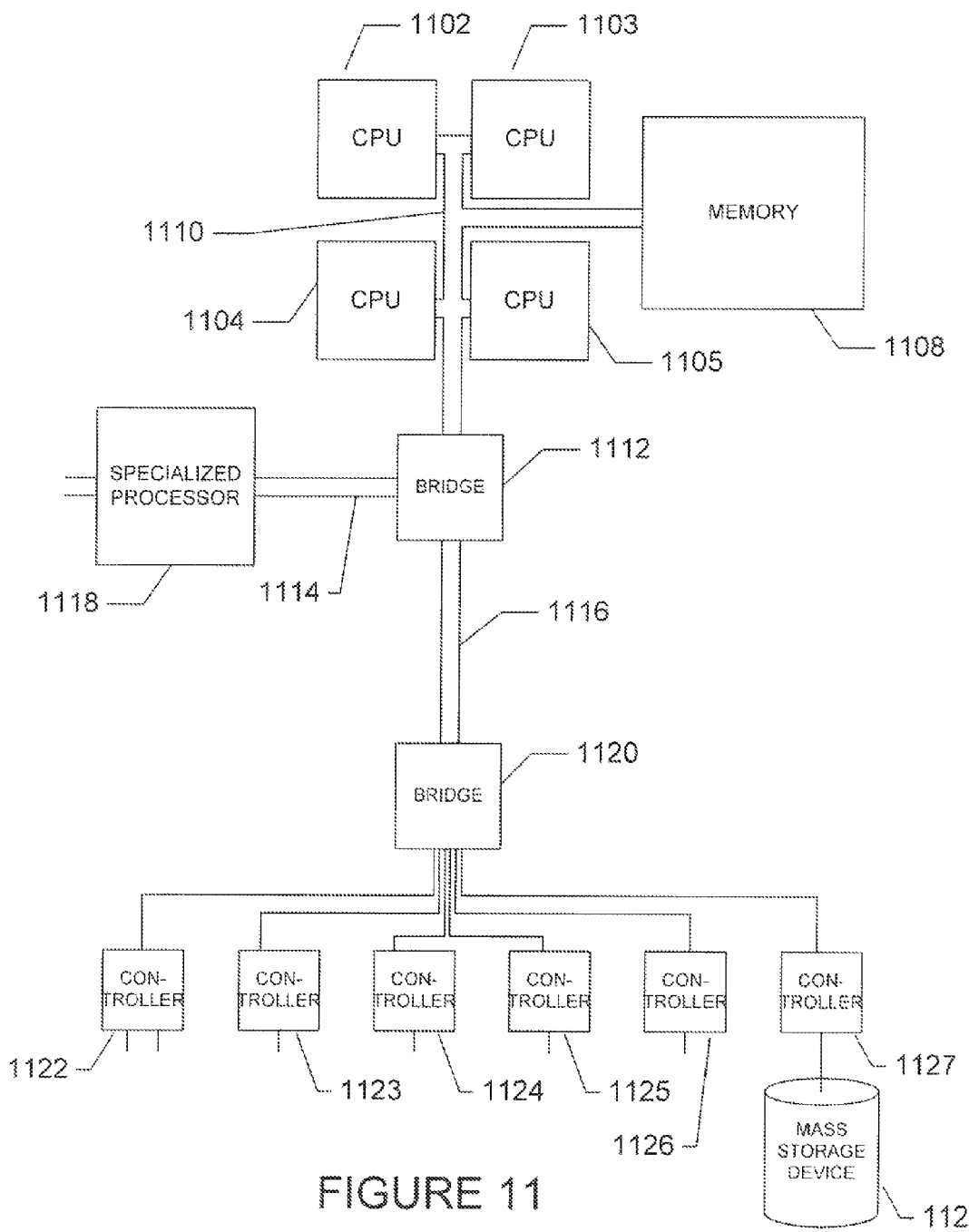
FIG. 11 illustrates a general-purpose computer system that, when executing a software-implemented multiple-source-data-compression-method embodiment of the present invention, comprises an embodiment of one component of a system embodiment of the present invention.

FIG. 11 illustrates a general-purpose computer system that, when executing a software-implemented multiple-source-data-compression-method embodiment of the present invention, comprises a system embodiment of the present invention. The computer system contains one or multiple central processing units ("CPUs") 1102-1105, one or more electronic memories 1108 interconnected with the CPUs by a CPU/memory-subsystem bus 1110 or multiple busses, a first bridge 1112 that interconnects the CPU/memory-subsystem bus 1110 with additional busses 1114 and 1116, or other types of high-speed interconnection media, including multiple, high-speed serial interconnects. These busses or serial interconnections, in turn, connect the CPUs and memory with specialized processors, such as a graphics processor 1118, and with one or more additional bridges 1120, which are interconnected with high-speed serial links or with multiple controllers 1122-1127, such as controller 1127, that provide access to various different types of mass-storage devices 1128, electronic displays, input devices, and other such components, subcomponents, and computational resources. Software instructions that implement a multiple-source-data-compression-method example of the present invention may be encoded and stored on any of various computer-readable media, including magnetic and optical disks and electronic memories. Examples of the present invention may also be implemented on distributed computer systems and can also be implemented partially or fully in hardware logic circuitry. Method implementations of the present invention are necessarily implemented for execution by computer systems and other electronic computing systems, since the method implementations involve large numbers of complex logic and arithmetic operations that need to be carried out reliably at rates sufficient to process data concurrently generated by many data sources.

Figure 12:
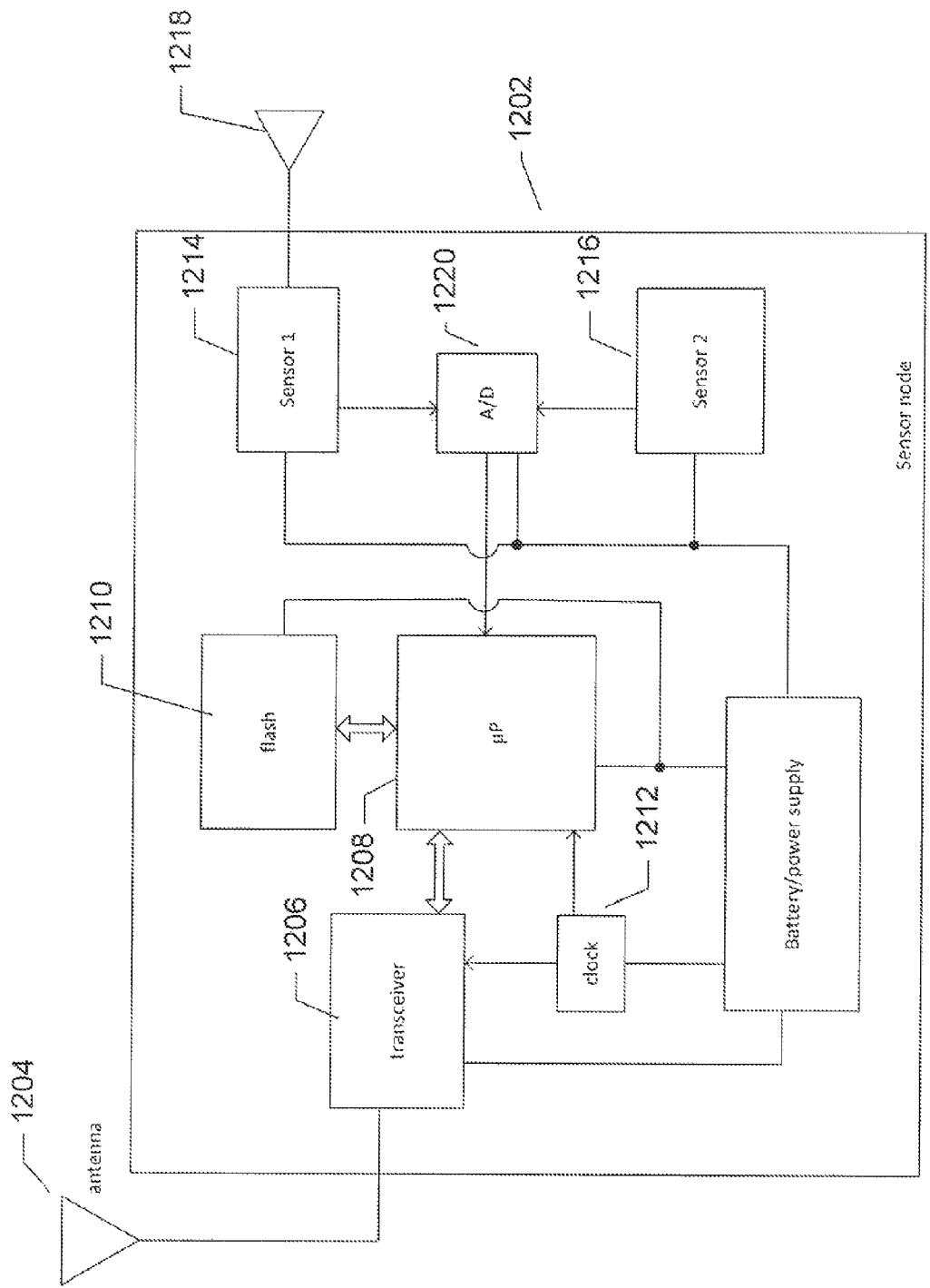
FIG. 12 illustrates internal components of a special-purpose sensor node.

Sensor nodes and sensor routers may themselves be small computer systems, with internal components similar to those of the computer system shown in FIG. 11 and including additional peripheral sensors connected to the small computer by any of many different wire-based or wireless communications media. Alternatively, sensor nodes may be special-purpose, often low-power-consuming devices housed within robust enclosures resistant to environmental agents, including water, wind, mechanical abrasion, sunlight, and other environmental agents. FIG. 12 illustrates internal components of a special-purpose sensor node. The sensor node 1202 receives messages from, and transmits messages to, a sensor router, remote computer, telecommunications station, or other remote entity via an external antenna 1204 and internal transceiver 1206, generally implemented as an integrated circuit. Operation of the sensor node is controlled by a microprocessor 1208, which includes internal memory for storing executable routines and memory 1210 for storing control programs, configuration information, and other such information to facilitate microprocessor control of the sensor node. The sensor node may include a separate clock 1212 for synchronizing communications and other operations. A sensor node generally includes at least one, and often more, sensor devices 1214 and 1216. Sensor devices often produce analog signals that are converted to equivalent digital signals by an analog-to-digital converter 1220 prior to input to the microprocessor 1208. Certain sensors may include external sensing devices 1218, such as temperature or pressure-measuring devices, while other sensor devices, such as sensor 1216 in FIG. 12, may be internal, such as accelerometers.

Many different types of distributed-sensor networks and data-transmission methods within various types of distributed-sensor networks are possible. There are opportunities for multiple-source data compression at each transmission level. For example, subsets of sensors may cooperate to transmit their recorded signals together, in a single transmission, to the sensor router, in which case inter-sensor data redundancies may be detected and eliminated during the course of compressing the signals from the subset of sensors. Similarly, the sensor router may collect transmitted signals from subsets of individual sensors and use a multi-data-source compression method of the present invention to compress all of the signals together for transmission to the remote computer system. The remote computer system may collect received transmitted signals from multiple sensor routers and use a multi-data-source compression method of the present invention to compress the multiple sensor-router signals together for efficient data storage. In some distributed-sensor networks, there may be multiple levels of routers organized in hierarchical fashion, at each level of which multiple-source data compression methods of the present invention may be employed. Alternatively, in some distributed-sensor networks, sensors may directly communicate with a computer system that processes the sensor data. Sensors may stream data to a sensor router or remote computer system continuously, or may store signal data over periods of time and transmit the data for each period of time at regular intervals. Sensors may transmit data according to an internal clock, or may be polled for data transmission by a sensor router or remote computer system.

Although the present invention has been described in terms of particular examples, it is not intended that the invention be limited to these examples. Modifications will be apparent to those skilled in the art. For example, multiple-data-source data-compression methods that represent examples of the present invention can be implemented in any of many different computer languages for use in many different electronic devices and systems by varying any of many implementation parameters, including operating-system platform, data structures, modular organization, control structures, and other such implementation parameters. Any of many different types of partitioning functions $f( )$ ordering functions that order partitions, and mappings from accumulated data to multiple sources can be employed to produce many different implementations of the present invention. It should be noted that multiple-data-source data-compression methods are necessarily carried out by software, firmware, logic-circuit, or hybrid processors or other control functionality within electronic devices and systems.

The foregoing description, for purposes of explanation, used specific nomenclature to provide a thorough understanding of the invention. However, it will be apparent to one skilled in the art that the specific details are not required in order to practice the invention. The foregoing descriptions of specific examples of the present invention are presented for purpose of illustration and description. They are not intended to be exhaustive or to limit the invention to the precise forms disclosed. Many modifications and variations are possible in view of the above teachings. The examples are shown and described in order to best explain the principles of the invention and its practical applications, to thereby enable others skilled in the art to best utilize the invention and various examples with various modifications as are suited to the particular use contemplated. It is intended that the scope of the invention be defined by the following claims and their equivalents:

The invention claimed is:

1. A method for compressing data messages generated by multiple data sources, the data messages containing encoded signals, the method comprising:
   extracting and partitioning, by an electronic computing system, the encoded signals into data partitions, the data included in each data partition containing inter-data-source redundancies; and
   for each data partition, compressing, by an electronic computing system, the data in the data partition to remove the inter-data-source redundancies,
   wherein compressing the data in the data partition to remove the inter-data-source redundancies further includes:
   when the data partition includes multiple encoded data source signals,
      normalizing and aligning the encoded data source signals;
      ordering the multiple encoded data source signals to produce an ordering of the encoded data source signals that facilitates detection of inter-data-source redundancies during data compression; and applying a two-dimensional compression method to compress the ordered multiple encoded data source signals.

2. The method of claim 1 wherein partitioning data generated by the multiple data sources into data partitions further comprises:
applying, to data produced by each of the multiple data sources, a partitioning function that returns a relatedness value; and
for each relatedness value, grouping data for which the partitioning function returned the relatedness value into a data partition associated with the relatedness value.

3. The method of claim 2, wherein the partitioning function computes a relatedness value for data to which the partitioning function is applied, the relatedness values reflecting relatedness of data with respect to inter-data-source redundancies.

4. The method of claim 1 further including, prior to partitioning and compressing the data:
during a time interval of interest,
receiving data messages from the multiple data sources; and
extracting data from the data messages for partitioning and compressing.

5. The method of claim 4 further including:
over a number of time intervals,
during each time interval,
receiving data messages from the multiple data sources;
extracting data from the data messages;
partitioning the data into data partitions; and
for each data partition, compressing the data in the data partition to remove the inter-data-source redundancies.

6. The method of claim 1, wherein the data sources are sensor nodes of a distributed-sensor network.

7. A distributed-sensor network comprising:
a plurality of sensor nodes; and
a data-collection entity to receive data messages from the sensor nodes and compress encoded sensor signals extracted from the data messages to remove inter-sensor-node data redundancy from the encoded sensor signals;
wherein the data-collection entity is to:
collect the data messages received from the sensor nodes during a time interval of interest;
extract the encoded sensor signals from the received data messages;
invoke a partitioning component to partition the encoded sensor signals received from the sensor nodes into data partitions containing inter-data-source redundancies; and
invoke a multiple-data-source data-compression component to compress the encoded sensor signals in each data partition to remove the inter-data-source redundancies; and
wherein, to compress the encoded sensor signals in a data partition to remove the inter-data-source redundancies, the multiple-data-source data-compression component is to:
normalize and align the encoded sensor signals;
order the normalized and aligned encoded sensor signals to produce an ordering of the encoded sensor signals to facilitate a detection of inter-data-source redundancies during data compression; and
apply a two-dimensional compression method to compress the ordered encoded sensor signals.

8. The distributed-sensor network of claim 7 wherein the data-collection entity includes:
the partitioning component that partitions encoded sensor signals received from the sensor nodes into data partitions; and
the multiple-data-source data-compression component that compresses the encoded sensor signals of each data partition to remove the inter-data-source redundancies.

9. The distributed-sensor network of claim 7, wherein to partition the encoded sensor signals received from the sensor nodes into data partitions, the partitioning component is to:
apply, to each of the encoded sensor signals received from one of the sensor nodes, a partitioning function that returns a relatedness value; and
for each relatedness value, group the encoded sensor signals for which the partitioning function returned the relatedness value into a data partition associated with the relatedness value.

10. The distributed-sensor network of claim 9,
wherein the relatedness value reflects a relatedness of data with respect to inter-data-source redundancies.

11. A router that compresses data generated by multiple data sources, the router comprising:
a partitioning component to partition encoded signals received from the data sources into data partitions;
a multiple-data-source data-compression component to compress the encoded signals of each data partition to remove the inter-data-source redundancies; and
a hardware processor to implement the partitioning component and the multiple-data-source data-compression component,
wherein the partitioning component is to:
apply, to each of the encoded signals received from one of the data sources, a partitioning function that returns a relatedness value; and
for each relatedness value, group the encoded signals for which the partitioning function returned the relatedness value into a data partition associated with the relatedness value;
wherein the relatedness value reflects a relatedness of data with respect to inter-data-source redundancies; and
wherein the data-compression component is to:
normalize and align the encoded signals;
order the normalized and aligned encoded signals to produce an ordering of the encode signals to facilitate a detection of inter-data-source redundancies during data compression; and
apply a two-dimensional compression method to compress the ordered encoded signals.

12. The router of claim 11,
wherein the data sources are sensor nodes of a distributed-sensor network; and
wherein the sensor nodes generate data messages containing the encoded sensor signals to be extracted and partitioned into data partitions.

13. A router that compresses data generated by multiple data sources, the router comprising:
a partitioning component to partition encoded signals received from the data sources into data partitions;
a multiple-data-source data-compression component to compress the encoded signals of each data partition to remove the inter-data-source redundancies; and
a hardware processor to implement the partitioning component and the multiple-data-source data-compression component,
wherein the multiple-data-source data-compression component is to:

normalize and align the encoded signals;

order the normalized and aligned encoded signals to produce an ordering of the encoded signals to facilitate a detection of inter-data-source redundancies during data compression; and apply a two-dimensional compression method to compress the ordered encoded signals.

14. The router of claim 13, wherein the data sources are sensor nodes of a distributed-sensor network; and wherein the sensor nodes generate data messages containing the encoded sensor signals to be extracted and partitioned into data partitions.

15. A distributed-sensor network comprising:

a plurality of sensor nodes; and a data-collection entity to receive data messages from the sensor nodes and compress the encoded sensor signals extracted from the data messages to remove inter-sensor-node data redundancy from the encoded sensor signals;

wherein the data-collection entity includes:

a partitioning component to partition the encoded sensor signals received from the sensor nodes into data partitions; and a multiple-data-source data-compression component to compress the encoded sensor signals of each data partition to remove the inter-data-source redundancies;

wherein the partitioning component is to:

apply, to each of the encoded sensor signals received from one of the sensor nodes, a partitioning function that returns a relatedness value; and for each relatedness value, group the encoded sensor signals for which the partitioning function returned the relatedness value into a data partition associated with the relatedness value;

wherein the relatedness value reflects a relatedness of data with respect to inter-data-source redundancies; and wherein the multiple-data-source data-compression component is to:

normalize and align the encoded sensor signals;

order the normalized and aligned encoded sensor signals to produce an ordering of the encoded sensor signals to facilitate a detection of inter-data-source redundancies during data compression; and apply a two-dimensional compression method to compress the ordered encoded sensor signals.

16. A distributed-seismic-sensor network including:

a plurality of sensor nodes to detect, record, and transmit signals related to ground movement;

a sensor router to receive signals from the plurality of sensor nodes and accumulate sensor data; and a data-storage and signal processing facility to receive the sensor data from the sensor router, wherein the sensor router is to:

accumulate sensor messages from the plurality of sensor nodes over a time interval, partition the accumulated sensor messages to form a set of message partitions, normalize and align the sensor messages in each message partition;

order the normalized and aligned sensor messages to produce an ordering of the sensor messages to facilitate a detection of inter-data-source redundancies during data compression, and apply a two-dimensional compression method to compress the ordered sensor messages, and transmit the compressed message to the data-storage and signal processing facility.

17. The distributed-seismic-sensor network of claim 16, wherein, to partition the accumulated sensor messages, the sensor router is to:

compute a relatedness value v for a sensor message by applying a partitioning function $f(m)$ to each message m in the accumulated sensor messages in order to partition the messages into a set of message partitions Q;

determine whether or not there is a message partition $q_i$ associated with the computed relatedness value v;

if not, then increment an index P and add a new message partition to Q associated with the relatedness value v;

in either case, then add a message m to the message partition $q_i$ associated with the relatedness value v; and continue the partition until all sensor messages have been partitioned.

* * * * *

UNITED STATES PATENT AND TRADEMARK OFFICE
CERTIFICATE OF CORRECTION

| | | |
|---|---|---|
| PATENT NO. | : 8,554,746 B2 | Page 1 of 1 |
| APPLICATION NO. | : 12/859220 | |
| DATED | : October 8, 2013 | |
| INVENTOR(S) | : Marcelo Weinberger et al. | |

It is certified that error appears in the above-identified patent and that said Letters Patent is hereby corrected as shown below:

On the Title page, in item (75), Inventors, in column 1, line 2, delete "Herman" and insert -- Hernan --, therefor.

In the Claims

In column 19, line 35, in Claim 6, delete "claim 1,wherein" and insert -- claim 1, wherein --, therefor.

In column 22, line 39, in Claim 17, delete "value v;" and insert -- value v; --, therefor.

Signed and Sealed this
Third Day of December, 2013

Margaret A. Focarino
*Commissioner for Patents of the United States Patent and Trademark Office*